(12) United States Patent
Elpelt et al.

(10) Patent No.: US 10,541,325 B2
(45) Date of Patent: Jan. 21, 2020

(54) SEMICONDUCTOR DEVICE WITH TERMINATION STRUCTURE INCLUDING FIELD ZONES AND METHOD OF MANUFACTURING

(71) Applicant: Infineon Technologies AG, Neubiberg (DE)

(72) Inventors: Rudolf Elpelt, Erlangen (DE); Roland Rupp, Lauf (DE); Reinhold Schoerner, Grossenseebach (DE); Larissa Wehrhahn-Kilian, Erlangen (DE); Bernd Zippelius, Erlangen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/171,911

(22) Filed: Oct. 26, 2018

(65) Prior Publication Data

US 2019/0131447 A1    May 2, 2019

(30) Foreign Application Priority Data

Oct. 27, 2017   (DE) ......................... 10 2017 125 242

(51) Int. Cl.
| | | |
|---|---|---|
| *H01L 21/04* | (2006.01) | |
| *H01L 29/78* | (2006.01) | |
| *H01L 29/06* | (2006.01) | |
| *H01L 29/10* | (2006.01) | |
| *H01L 29/66* | (2006.01) | |
| *H01L 29/861* | (2006.01) | |
| *H01L 29/16* | (2006.01) | |

(52) U.S. Cl.
CPC ........ *H01L 29/7811* (2013.01); *H01L 21/046* (2013.01); *H01L 29/0696* (2013.01); *H01L 29/1095* (2013.01); *H01L 29/6606* (2013.01); *H01L 29/66068* (2013.01); *H01L 29/8611* (2013.01); *H01L 29/0619* (2013.01); *H01L 29/1608* (2013.01)

(58) Field of Classification Search
CPC ........................... H01L 21/04; H01L 21/0455
See application file for complete search history.

(56) References Cited

U.S. PATENT DOCUMENTS

2010/0291762 A1    11/2010   Tarui

FOREIGN PATENT DOCUMENTS

| DE | 112012006039 T5 | 12/2014 |
|---|---|---|
| DE | 112015002153 T5 | 1/2017 |
| DE | 102015114429 B4 | 5/2017 |

OTHER PUBLICATIONS

Tantraporn, Wirojana, et al., "Multiple-Zone Single-Mask Junction Termination Extension—A High-Yield Near-Ideal Breakdown Voltage Technology", IEEE Transactions on Electron Devices, vol. Ed-34, No. 10, Oct. 1987, pp. 2200-2210.

*Primary Examiner* — Cheung Lee
(74) *Attorney, Agent, or Firm* — Murphy, Bilak & Homiller, PLLC

(57) ABSTRACT

In termination regions of a silicon carbide substrate field zones are formed by ion implantation. By laterally modulating a distribution of dopants entering the silicon carbide substrate by the ion implantation, a horizontal net dopant distribution in the field zones is set to fall from a maximum net dopant concentration Nmax to Nmax/e within at least 200 nm, with e representing Euler's number. The field zones form first pn junctions with a drift layer.

28 Claims, 20 Drawing Sheets

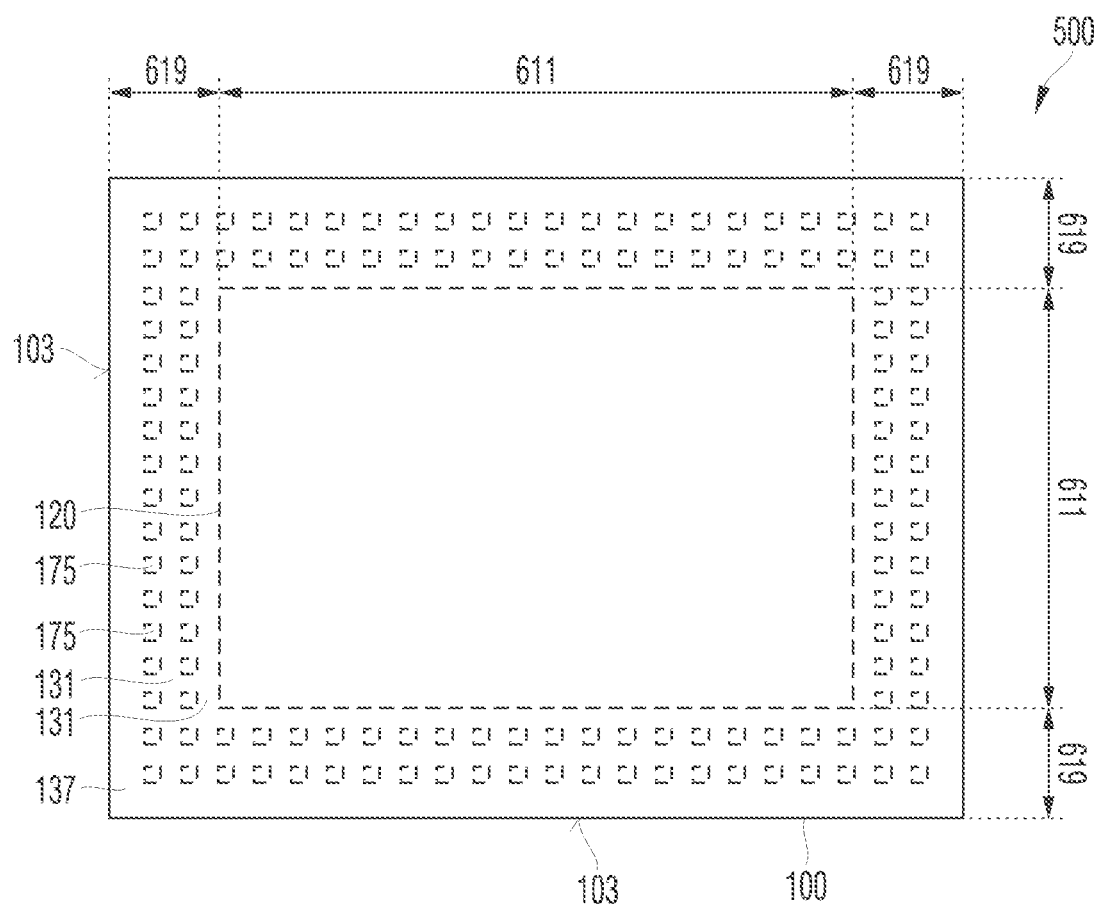

SEMICONDUCTOR DEVICE WITH TERMINATION STRUCTURE INCLUDING FIELD ZONES AND METHOD OF MANUFACTURING

BACKGROUND

Vertical power semiconductor devices control a load current flow between a first load electrode at a front side and a second load electrode on the back of a semiconductor die. In the off state, a blocking voltage drops vertically across the semiconductor die between the first load electrode at the front side and the second load electrode on the back and drops laterally across a termination region between an active region and a doped edge region that is formed along the lateral surface of the semiconductor die and that is connected to the electric potential of the second load electrode. Power semiconductor devices may include multi-zone junction termination extensions with outwardly decreasing dopant concentration or floating guard rings around the central region in order to shape the electric field in the termination region in a way that avoids field crowding along the front side. For semiconductor materials with low diffusion coefficients formation of robust multi-zone junction termination structures and guard rings is often accompanied by challenging processes like multiple implants, oxide step etching, multiple etched mesas or grayscale lithography.

There is a need for improved termination structures and for methods for forming such termination structures.

SUMMARY

Embodiments of the present disclosure relate to a method of manufacturing a semiconductor device. In termination regions of a silicon carbide substrate, field zones are formed by ion implantation, wherein by laterally modulating a distribution of dopants entering the silicon carbide substrate by the ion implantation, a horizontal net dopant distribution in the field zones is set to fall from a maximum net dopant concentration Nmax to Nmax/e within at least 100 nm, wherein e represents Euler's number. The field zones form first pn junctions with a drift layer in the silicon carbide substrate.

Further embodiments of the present disclosure relate to a semiconductor device. The semiconductor device includes a drift zone formed in a semiconductor portion of silicon carbide. The semiconductor portion includes a central region and a termination region surrounding the central region. The drift zone is formed at a distance to a first surface of the semiconductor portion. The semiconductor device further includes a plurality of field zones in the termination region. The field zones form first pn junctions with the drift zone. In the field zones a horizontal net dopant distribution N(x) parallel to the first surface falls from a maximum value Nmax to Nmax/e within at distance of least 100 nm, with e representing Euler's number.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments and together with the description serve to explain principles of the embodiments. Further embodiments and intended advantages will be readily appreciated as they become better understood by reference to the following detailed description.

FIG. 15B is a schematic horizontal cross-sectional of a semiconductor portion of a silicon carbide device according to an embodiment related to field zones arranged along lines forming frames around a central region.

DETAILED DESCRIPTION

Figure 1:
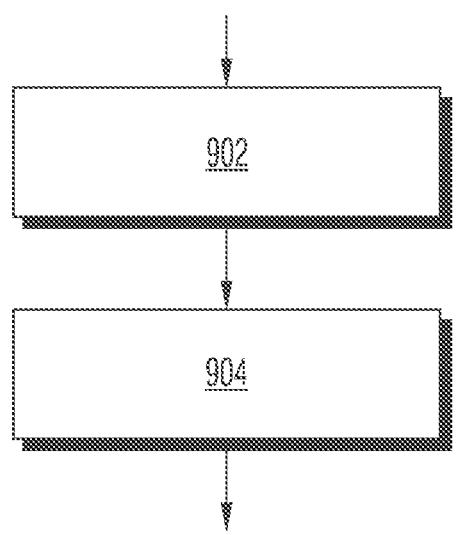
FIG. 1 is a simplified flowchart illustrating a method of forming a termination structure including laterally spaced field zones with smooth horizontal dopant distributions according to an embodiment.

In the following detailed description, reference is made to the accompanying drawings, which form a part thereof and in which are shown by way of illustrations of specific embodiments in which a semiconductor device and a method of manufacturing a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

The mean transmittance of a region is the average fraction of incident electromagnetic power of an exposure radiation that is transmitted through the region. The mean transmittance increases with increasing area ratio between the transparent ("clear") areas in the region and the total area of the region, wherein a correlation between the mean transmittance and the area ratio is not necessarily linear.

FIG. 1 relates to a method of manufacturing a semiconductor device that includes a termination structure including separated field zones with smooth, gradual horizontal dopant profiles that fall from a maximum net dopant concentration Nmax to Nmax/e, i.e., from 100% to about 37%, across a distance of at least 200 nm. Specifically, the gradual horizontal dopant profile in at least one of the field zones, or each of the field zones, may fall from a maximum net dopant concentration Nmax to Nmax/e, across a distance of at least 200 nm.

A drift layer is formed in a silicon carbide (SiC) substrate (902). Formation of the drift layer may include growing by epitaxy a lightly doped layer of a first conductivity type on a process surface of a base substrate of a single crystalline silicon carbide material, for example, 4H—SiC or 6H—SiC, to form the SiC substrate. The SiC substrate includes device regions arranged in, for example, lines and rows and a kerf region separating neighboring device regions. Each device region includes a central region with active elements defining the functionality of the semiconductor devices and a termination region between the central region and the kerf region.

One or more separated field zones, which are laterally spaced from one another, form pn junctions with the drift layer. The field zones are formed between a main surface of the SiC substrate and the drift layer, wherein an ion beam is used. A beam modulation structure laterally modulates the lateral distribution of the dopants entering the SiC substrate to form the field zones with a net dopant concentration steadily falling from a maximum value Nmax to Nmax/e per at least 200 nm, e.g., per at least 500 nm lateral distance (904) along a line orthogonal to an edge of the field zone, wherein e is Euler's number.

The termination structure keeps the maximum lateral electric field strength sufficiently low to suppress premature avalanche breakdown in the termination region and to significantly reduce electrical stress in dielectric layers formed above the termination structure.

In semiconductor materials with high diffusion coefficients for dopant atoms, a smooth pn junction along which the dopant concentration changes at a comparatively moderate rate across a comparatively wide lateral distance results in a smooth gradient of the electric potential and in low peak electric field strengths. In semiconductor materials with low diffusion coefficients for dopant atoms, for example, for aluminum and nitrogen in silicon carbide, lateral pn junctions formed by masked implants are comparatively steep resulting in steep changes of the electric potential and in high peak electric field strength.

In termination structures including field rings, the lateral voltage drop distributes across a plurality of floating field rings formed between active elements in the central region of the device and the lateral device edge. By laterally modulating, i.e. shaping, the distribution of dopants that enter the SiC substrate in a way that the density of dopants in a cross-section orthogonal to the beam axis of the ion beam shows stepless, gradual transitions, the field zones of a termination structure can be formed with comparatively smooth lateral junctions. The beam modulation structure may use a combination of local absorption and shadowing of the dopants, a combination of local absorption and scattering of the dopants, or may include a reflow mask.

The resulting lateral junctions, which may be pn junctions, p/p$^+$ junctions or n/n$^+$ junctions to a homogenously doped junction termination region of the same conductivity type as the field zones, extend across a comparatively wide lateral distance such that the electric potential decreases more smoothly and peak electric field strength is significantly reduced by at least 50% compared to approaches based on implant masks with steep sidewalls.

The reduced peak electric field strength also contributes to improved device ruggedness, e.g., in view of the reliability of dielectric structures formed at the front side. Since the lateral junctions extend across a greater lateral distance, deviations of an implant dose and deviations caused by lithographic misalignment or fluctuations in further patterning processes have less impact on the device characteristics and result in not more than a slight lateral displacement of the effective junctions. The impact of external charges that may accumulate during fabrication or during operation along the surface of the SiC substrate remains low.

Figure 2A:
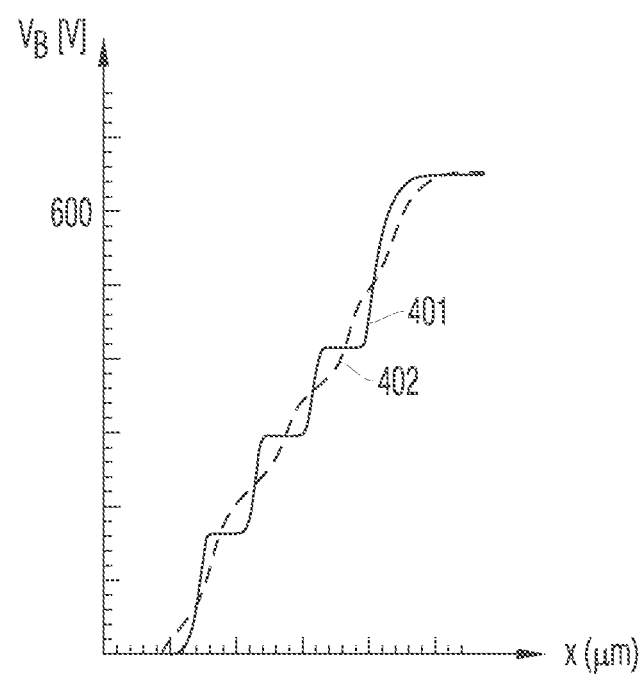
FIG. 2A is a schematic diagram illustrating voltage distributions along a surface of semiconductor portions for discussing effects of the embodiments.

FIG. 2A shows the effect of a termination structure including floating field zones with smooth pn junctions according to an embodiment related to a silicon carbide device with a blocking voltage of 650 V and with four field zones forming four separated and equally spaced field rings at a center-to-center distance of about 5 µm to each other.

Line 401 plots the lateral potential distribution along a first surface at a front side of the semiconductor portion of a comparative device, which four field zones show steep lateral pn junctions. Line 402 roughly approximates the lateral potential distribution along the first surface for a semiconductor device according to an embodiment with smooth lateral pn junctions laterally extending across about 1 µm, respectively. The smooth pn junctions significantly reduce steepness of the lateral potential.

Figure 2B:
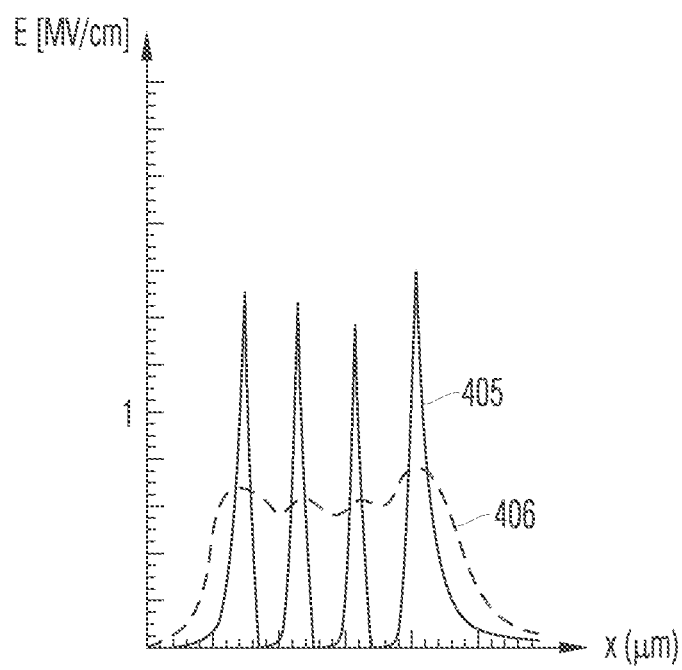
FIG. 2B is a schematic diagram illustrating electric field strength distributions along a surface of semiconductor portions for discussing effects of the embodiments.

FIG. 2B refers to the lateral electric field strength along the first surface, wherein line 405 refers to the comparative device and line 406 roughly approximates the lateral electric field strength in the semiconductor device according to the embodiment with the smooth pn junctions. The maximum electric field strength is at most 30% of the maximum of the maximum electric field strength in the comparative example.

Figure 3A:
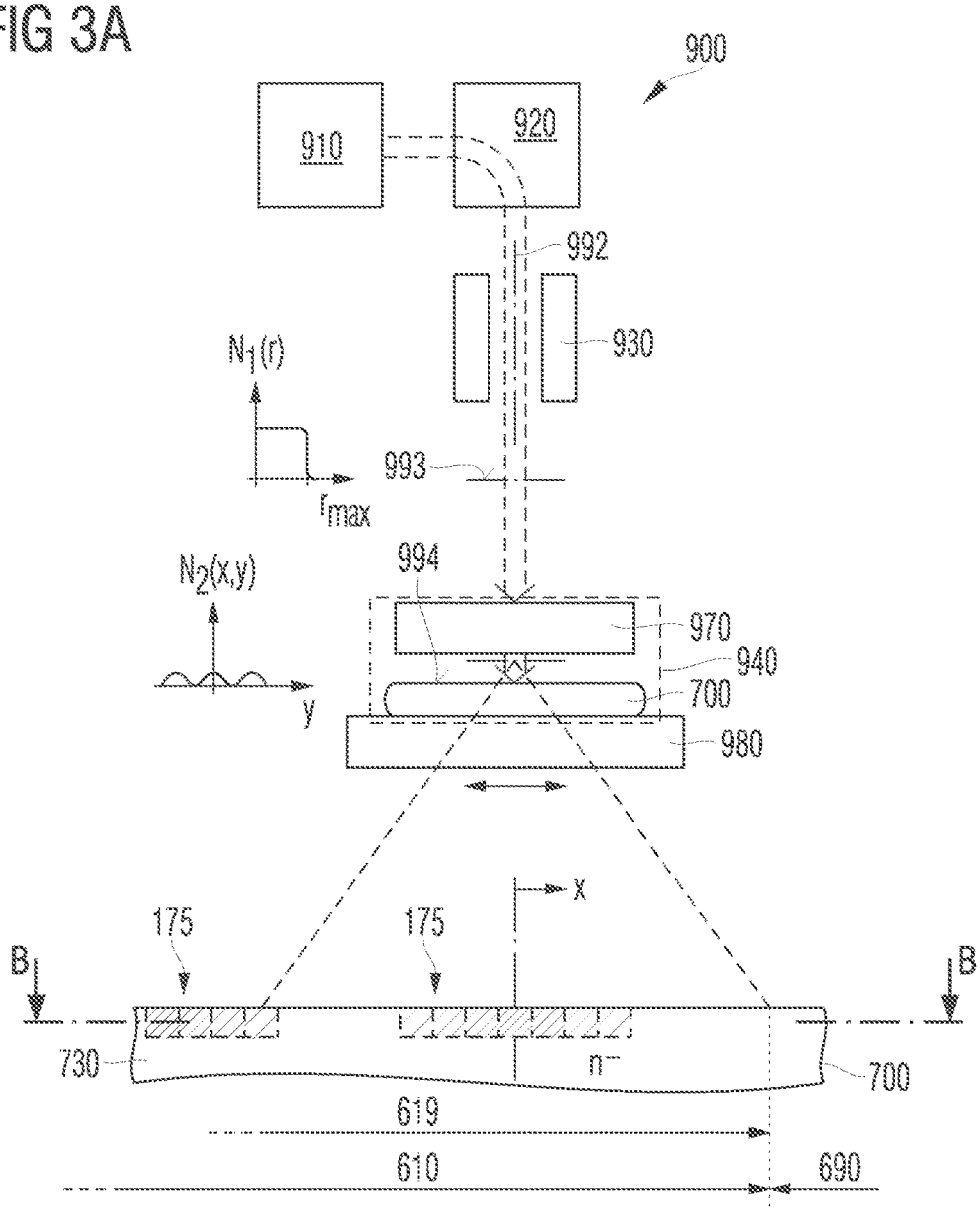
FIG. 3A is a schematic block diagram of an ion implantation apparatus for illustrating a method of forming a termination structure including laterally separated field zones with smooth lateral pn junctions according to another embodiment.

FIG. 3A shows an ion implantation apparatus 900 including an ion source 910 emitting ions, for example nitrogen ions or aluminum ions. An acceleration unit 920 may accelerate a selected type of ions and may filter out others. A collimator unit 930 may align the directions of motion of the ions in a direction parallel to a beam axis 992 and may direct a collimated ion beam 912 at a predefined implant angle, e.g., approximately perpendicular, onto a target assembly 940. The target assembly 940 may be temporarily fixed, e.g., electrostatically chucked onto a substrate carrier 980. In a plane 993 orthogonal to the beam axis 992 an ion distribution N1(r) in the collimated ion beam 912 is point symmetric to the beam center at r=0 and highly uniform for 0<r<rmax.

Collimated ion beam 912 and substrate carrier 980 may be movable with respect to each other along two orthogonal horizontal directions. For example, the substrate carrier 980 with the target assembly 940 may be movable with respect to the collimated ion beam 912 along a first horizontal direction and the collimator unit 930 may guide the collimated ion beam 912 along a second horizontal axis orthogonal to the first horizontal direction. According to another embodiment substrate carrier 980 and collimator unit 930 may allow a rotational movement of the target assembly 940 with respect to the collimated ion beam 912.

The target assembly 940 includes a silicon carbide substrate 700 and a beam modulation structure 970, wherein the SiC substrate 700 may be temporarily fixed, for example, electrostatically chucked onto a surface of the substrate carrier 980. The beam modulation structure 970 is arranged or formed between the collimator unit 930 and a main surface 701 of the SiC substrate 700 and laterally modulates the collimated ion beam 912 such that in the plane 994 of the main surface 701 the lateral modulated dopant distribution N2(x,y) gradually decreases from a maximum value N2max to N2max/e per at least 200 nm, e.g., per at least 500 nm, wherein e denotes Euler's number, which is approximately 2.72.

The beam modulation structure 970 may include an implant mask directly formed on the main surface 701 at the front side of the SiC substrate 700 or may be a separated beam modifier device placed in the ion beam path at a distance to the main surface 701.

The resulting lateral distribution of dopants entering the SiC substrate 700 forms field zones 175 in termination regions 619 of device regions 610 in the SiC substrate 700 between the main surface 701 and a drift layer 730, wherein each termination region 619 surrounds a central region of the device region 610 and wherein a kerf region 690 separates neighboring device regions 610, which are arranged in lines and rows.

The beam modulation structure 970 uses local modification of absorption or may combine local modification of absorption and at least one of ion scattering and beam shading in a way that the field zones 175 have a net dopant distribution that gradually decreases from a maximum dopant concentration Nmax to Nmax/e per at least 200 nm, e.g., per at least 500 nm.

Figure 3B:
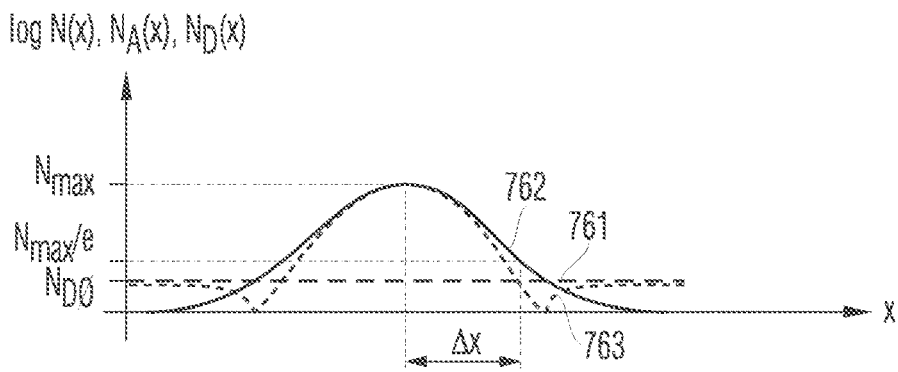
FIG. 3B is a schematic diagram illustrating a portion of the horizontal dopant distribution along line B-B in FIG. 3A.

FIG. 3B shows horizontal dopant distributions through the field zone 175 of FIG. 3A and refers to an embodiment with n-type drift zone 135 and p-type field zone 175, wherein line 761 shows the horizontal donator distribution ND(x), line 762 the horizontal acceptor distribution NA(x) and line 763 the horizontal net dopant distribution N(x).

The donator distribution ND(x) may result from gas phase doping during epitaxy, wherein ND(x) is approximately uniform with a mean value ND0, wherein the mean value ND0 may be equal to the dopant concentration in the drift layer 730. The horizontal acceptor distribution NA(x) falls from a maximum value NAmax to NAmax/e within a distance of at least 200 nm. The maximum acceptor concentration NAmax may be in a range from 5E16 cm$^{-3}$ to 2E18 cm$^{-3}$, for example, in a range from 1E17 cm$^{-3}$ to 1E18 cm$^{-3}$.

With NAmax>>ND0, within the field zones 175 the horizontal net dopant distribution N(x) given by line 763 closely approximates the horizontal acceptor distribution NA(x) given by line 762 and falls from the maximum value Nmax to Nmax/e within a distance $\Delta x$ of at least 200 nm, at least 500 nm, or at least 800 nm such that a transition of N(x) from NAmax to ND0 is soft, i.e., distributes across a comparatively wide horizontal distance.

Figure 4A:
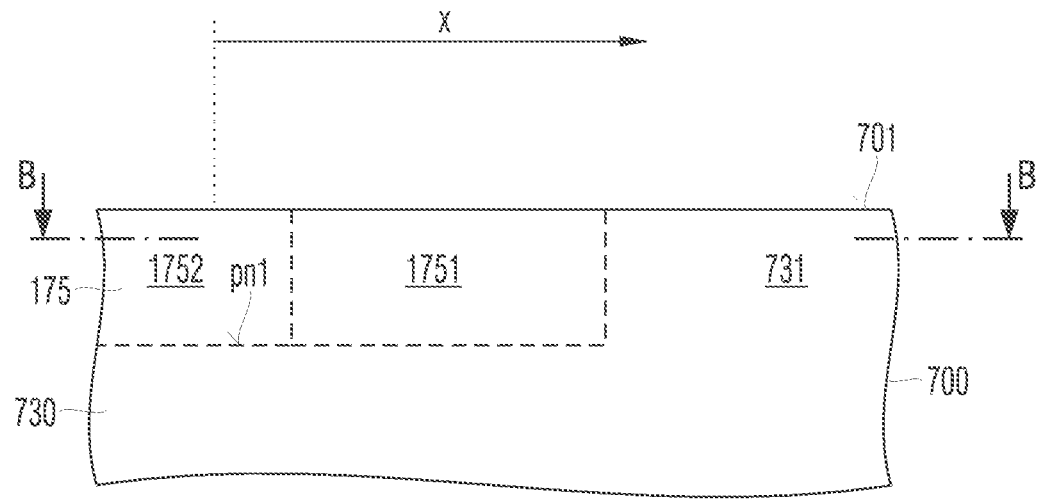
FIG. 4A is a schematic vertical cross-sectional view of a portion of a field zone according to an embodiment related to a horizontal dopant distribution approximating the error function.
Figure 4B:
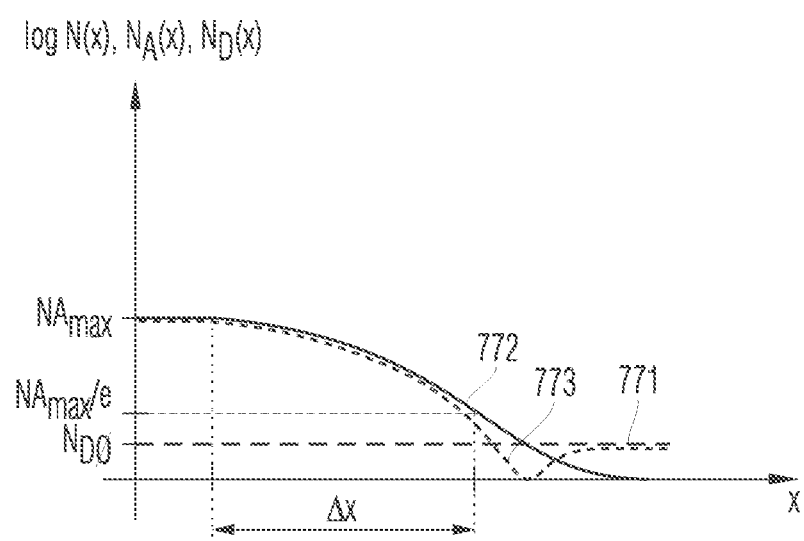
FIG. 4B is a schematic diagram illustrating the horizontal dopant distribution along line B-B in FIG. 4A.

FIGS. 4A and 4B relate to details of field zones 175 formed according to the embodiments.

FIG. 4A shows a portion of field zone 175 extending from a main surface 701 into a silicon carbide substrate 700. The SiC substrate 700 may be a silicon carbide substrate, e.g., of 4H—SiC (SiC of the 4H—polytype) or 6H—SiC and may include a base substrate, wherein the base substrate may be a silicon carbide slice obtained from a silicon carbide ingot by sawing, by way of example. The base substrate may be heavily doped, for example heavily n-doped. An epitaxy process may form an epitaxial layer on a process surface of the base substrate. The SiC substrate 700 may include further doped regions, for example, an anode/body region forming an anode region of a semiconductor diode or body regions of transistor cells. A normal to the main surface 701 defines a vertical direction and directions parallel to the main surface 701 are horizontal directions which are also referred to as lateral directions in the following.

The field zone 175 may be formed in a portion of the epitaxial layer adjoining the main surface 701 and forms a first pn junction pn1 with a portion of the epitaxial layer forming a drift layer 730. A separation portion 731 of the drift layer 730 may laterally separate the field zone 175 from other regions of the same conductivity type. The field zone 175 may include first field zone sections 1751. In the first field zone sections 1751 (e.g., each of the first field zone sections 1751), the concentration of dopants of a conductivity type determining the conductivity type of the field zone 175 gradually decreases from a maximum value. The field zone 175 may further include a second field zone section 1752 with uniform dopant concentration between two first field zone sections 1751.

Along the vertical direction, a dopant profile of the field zones 175 may be undulated with two or more local maxima and one or more local minima. Alternatively, the implant forming the field zones 175 may pass an energy filter such that the vertical dopant profile in the field zones 175 is approximately box-shaped, i.e., approximately uniform.

As illustrated in FIG. 4B the field zone 175 may contain a uniform background doping of the conductivity type of the drift layer 730, e.g., an n-type dopant distribution 771 with the value of the background dopant concentration ND0 in the drift layer 730. The field zones 175 may be defined by the p-type dopant distribution 772 of implanted p-type dopants, wherein in the first field zone section 1751 the p-type dopant distribution NA(x) gradually decreases from a maximum value NAmax to NAmax/e across a lateral distance $\Delta x$ of at least 200 nm, e.g., per at least 500 nm. Since within $\Delta x$ NA(x) is significantly greater than ND0, the resulting net dopant distribution N(x) (line 773) closely follows NA(x) in the range of interest.

With x=0 defining the position at which the dopant concentration of the p-type dopants of the field zones 175 starts to decrease, equation (1) approximates the p-type dopant gradient NA(x), wherein the p-type dopant gradient NA(x) may be approximated by the error function erf(x) as given in equation (1):

$$NA(x) \approx NA_{max} \cdot 0.5 \cdot [1 - erf((x-x0)/(\sigma \cdot \sqrt{2}))] \quad (1)$$

In equation (1) x0 indicates a lateral position at which NA(x) starts to fall. $\Delta x$, which is the value of x at which NA(x) drops to 1/e, is given by $\sigma$. According to an embodiment $\sigma$ is at least 200 nm, for example, equal to or greater than 500 nm. According to an embodiment $\sigma$ is at least 800 nm.

Due to the lateral shaping of the distribution of dopants entering the SiC substrate 700 by using at least one of the methods described below, a lateral minimum distance between the maximum value of the net dopant distribution Nmax in the field zones 175 and the point at which the dopant types have equal concentration is significantly greater than in the case of implants using approximately vertical mask edges.

Figure 5A:
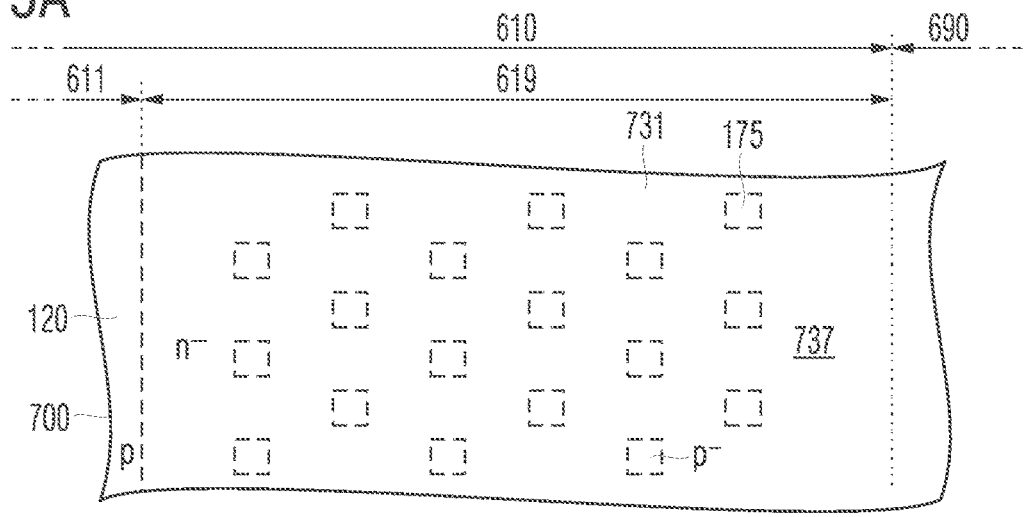
FIG. 5A is a schematic horizontal cross-sectional view of a portion of a semiconductor device with a termination region including laterally spaced field zones with smooth lateral pn junctions according to an embodiment related to field zones formed along lines.
Figure 5B:
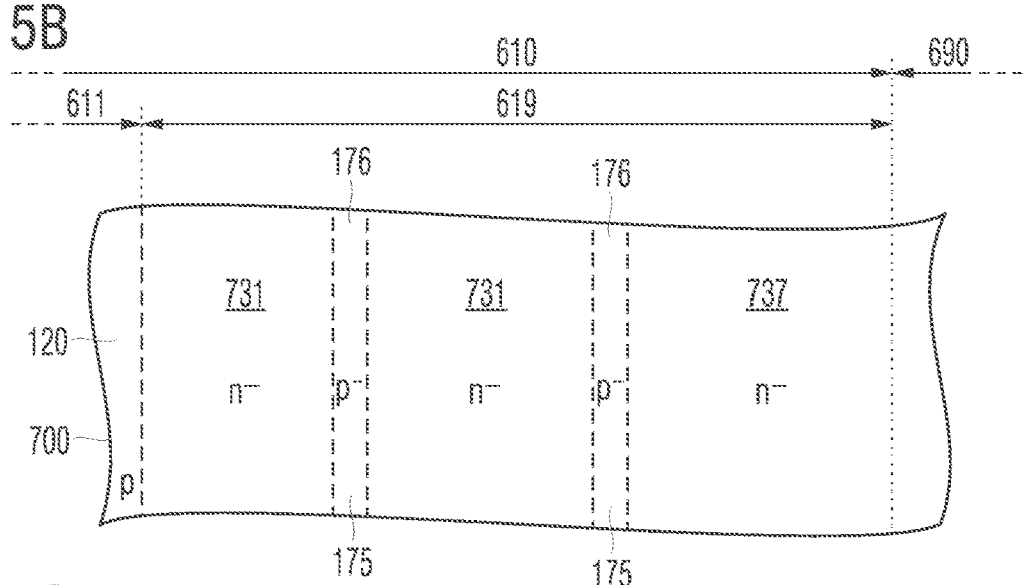
FIG. 5B is a schematic horizontal cross-sectional view of a portion of a semiconductor device with a termination region including laterally spaced field zones with smooth lateral pn junctions according to an embodiment related to field rings with vertical pn junctions.
Figure 5C:
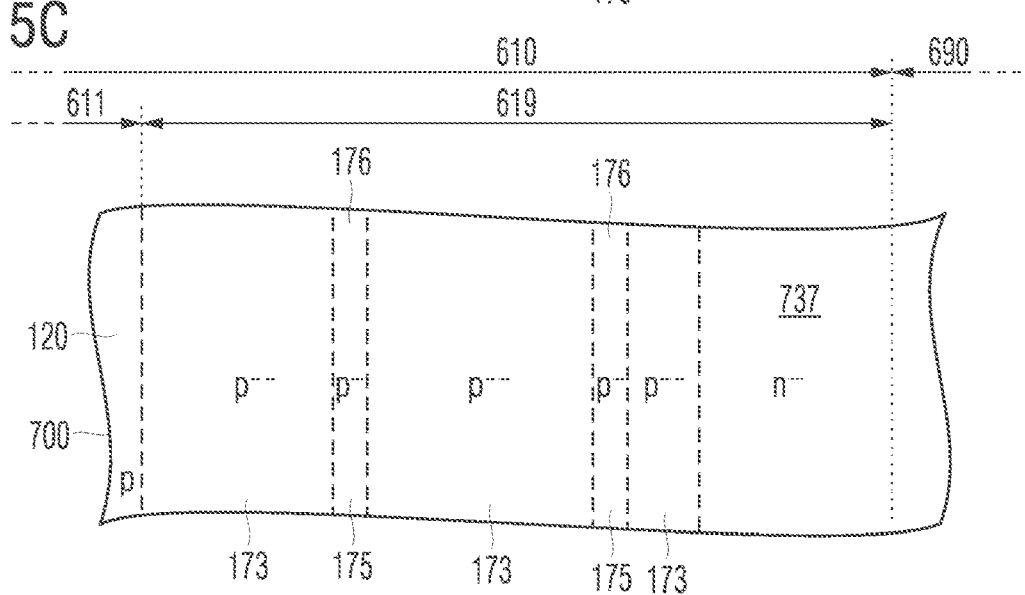
FIG. 5C is a schematic horizontal cross-sectional view of a portion of a semiconductor device with a termination region including separated field zones with smooth lateral dopant distributions according to an embodiment related to field rings embedded in a lightly doped junction termination region of the same conductivity type.

FIGS. 5A to 5C show portions of termination regions 619 of device regions 610, wherein the termination regions 619 separate a kerf region 690 from central regions 611 of the device regions 610 and wherein each central region 611 may include an anode/body region 120 of the conductivity type of the field zones 175.

In FIG. 5A the field zones 175 may be laterally separated from each other in all lateral directions by a grid-like separation portion 731 of the drift layer 730. Edge sections 737 of the drift layer 730 are formed in the termination regions 619 between the outermost field zones 175 and the kerf region 690. The field zones 175 may directly adjoin one another such that portions of the field zones 175 with a net dopant concentration not more than 25%, not more than 20% or not more than 10% of Nmax form a lightly doped junction termination region.

The field zones 175 may be arranged in lines, wherein four lines of field zones 175 on the four sides of the central region 611 may complete each other to a frame of separated field zones 175, wherein the frame of separated field zones 175 surrounds the central region 611 and wherein the termination region 619 may include two, three or more frames of laterally separated field zones 175.

In FIG. 5B each field zone 175 forms a continuous field ring 176 completely surrounding the central region 611. Each termination region 619 may include at least two, e.g., four equally spaced field rings 176 separated by frame-like separation portions 731 of the drift layer 730. A lateral extension of the field rings 176 may be in a range from 1 to 15 µm or 2 µm to 10 µm or 3 µm to 5 µm. A distance between neighboring field rings 176 may be in a range from 0.5 to 10 µm or 1.5 µm to 5 µm.

In FIG. 5C sections of a lightly doped junction termination region 173 laterally space neighboring field rings 176 from one another. Sections of the lightly doped junction termination region 173 are formed between neighboring field rings 176 and separate them from each other. In the lightly doped junction termination region 173 a dopant concentration may be uniform and at most 25%, at most 20% or at most than 10% of Nmax.

Figure 6A:
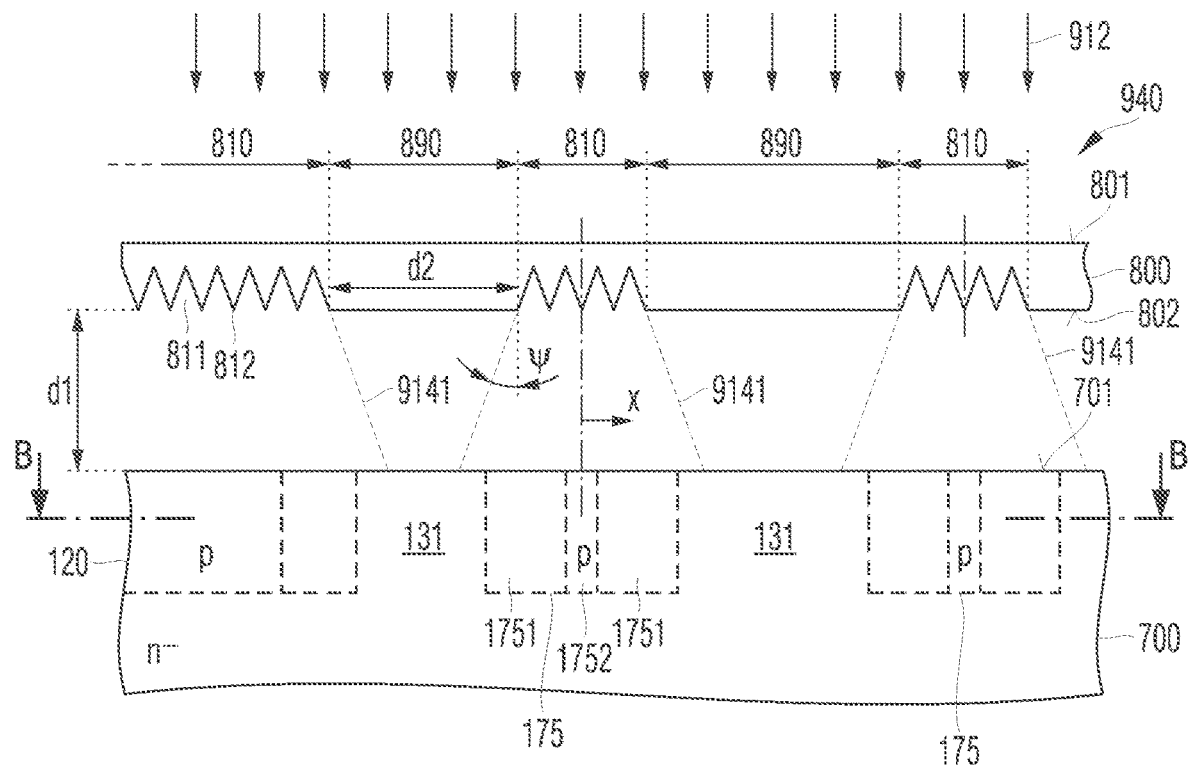
FIG. 6A is a schematic cross-sectional view of a portion of an arrangement including a beam modifier device and a silicon carbide substrate for illustrating formation of laterally spaced field zones with smooth lateral pn junctions according to an embodiment.
Figure 6B:
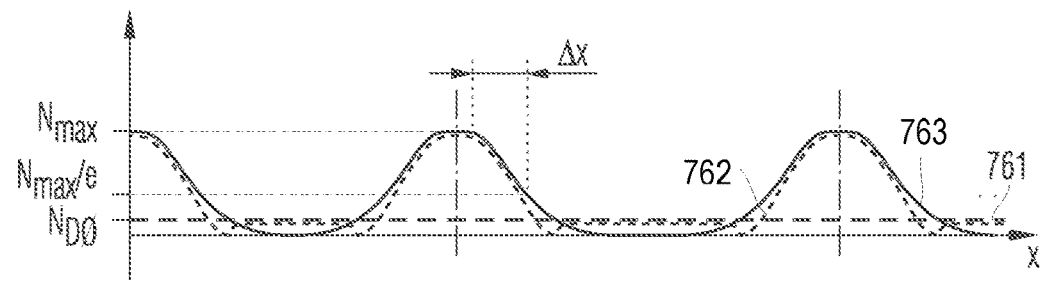
FIG. 6B is a schematic diagram illustrating lateral dopant gradients in the silicon carbide substrate along line B-B of FIG. 6A in case of field zones laterally separated by counter-doped regions.
Figure 6C:
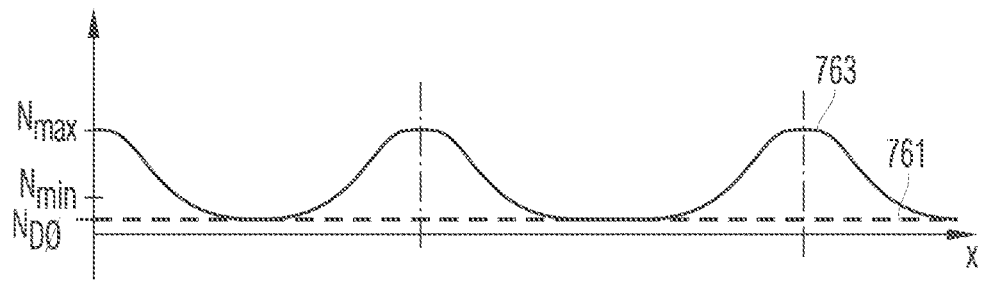
FIG. 6C is a schematic diagram illustrating lateral dopant gradients in the silicon carbide substrate along line B-B of FIG. 6A in case of field zones embedded in a lightly doped junction termination region.

In FIGS. 6A to 6C the beam modulation structure 970 of FIG. 3A includes a beam modifier device 800 that laterally modulates the collimated ion beam 912 by combining at least one of ion absorption and ion reflection with ion scattering.

The beam modifier device 800 is formed from one or more materials which form sufficiently stable structures at a thickness at which the materials are sufficiently permeable for ions used as dopants in silicon carbide substrates with low diffusion coefficients for the dopants, e.g., aluminum and nitrogen ions for doping silicon carbide substrates.

For example, the beam modifier device 800 is formed from materials that form stable, thin substrates like membranes or foils, for example, square foils with an edge length of about 75 mm or more, e.g., about 200 mm or 300 mm or round foils with a diameter of at least 100 mm, e.g., about 200 mm or 300 mm. According to an embodiment, the beam modifier device 800 mainly contains or consists of aluminum (Al) or silicon (Si).

A front side surface 801 of the beam modifier device 800 may be completely planar or may be planar with features protruding from the mainly planar portion. A rear side surface 802 opposite to the front side surface 801 may include a 3D pattern including grooves and protrusions, wherein a mean plane of the grooves and protrusions is parallel to the front side surface 801. The rear side surface 802 may be patterned by etching processes or by processes using a template or cast, e.g., by press molding or by stamping.

The beam modifier device 800 includes shading sections 890 and diverging sections 810 between the shading sections 890. In the shading sections 890 a permeability for ions of the collimated ion beam 912 is lower than in the diverging sections 810. According to an embodiment the shading sections 890 absorb and/or reflect the majority of ions impinging onto the front side surface 801. For example, the shading sections 890 completely absorb ions impinging onto the front side surface 801.

In the diverging sections 810 the ions impinging on the front side surface 801 pass the beam modifier device 800, wherein scattering of ions in the beam modifier device 800 results in that the ions passing a diverging section 810 form a diverging ion beam cone 9141. A plurality of such ion beam cones 9141 define the lateral distribution of the dopants in the plane of the main surface 701.

A distance d1 between the main surface 701 of the SiC substrate 700 and the rear side surface 802 of the beam modifier device 800 may be selected such that neighboring diverging ion beam cones 9141 do not laterally overlap or overlap only to a degree such that in the overlapping region a complementary background doping of the drift layer 730 is not overcompensated. For example, with d2 defining the distance between neighboring diverging sections 810 and Ψ denoting the cone angle, the distance d1 may be set according to equation (2):

$$d1 \leq d2/(2 \cdot \tan(\Psi)) \quad (2)$$

According to other embodiments the distance d1 between the main surface 701 of the SiC substrate 700 and the rear side surface 802 of the beam modifier device 800 may be selected such that neighboring diverging ion beam cones 9141 do overlap to a degree such that in the overlapping region the complementary background doping of the drift layer 730 is overcompensated.

Within each diverging ion beam cone 9141 the density of ions in a horizontal cross-section parallel to the main surface 701 decreases gradually with increasing distance to a center of the ion beam cone 9141 at least in outer portions of the diverging ion beam cone 9141.

The diverging sections 810 may include dents 811 and protrusions 812 between neighboring dents 811, wherein the dents 811 extend from the back into the beam modifier device 800. The dents 811 of the same diverging section 810 may have the same vertical and horizontal extension or may have different vertical and horizontal extensions. According to an embodiment, the dents 811 may have a vertical extension in a range from 100 nm to 10 µm, for example in a range from 0.2 µm to 8 µm. Vertical cross-sections of the dents 811 and protrusions 812 may be rectangles with or without rounded or beveled edges, triangles with or without flattened top or columns with rounded or semicircular tops. In the illustrated embodiment, vertical cross-sections of both the dents 811 and the protrusions 812 are triangles of the same vertical extension.

The diverging sections 810 attenuate the ions of the diverging ion beam cones 9141, wherein the attenuation increases with the path length within the beam modifier device 800. Since the path lengths in the diverging sections 810 distribute across a range between a short path through the beam modifier device 800 in a projection of the bottom of the dents 811 and a long path through the beam modifier device 800 in a projection of the top of the protrusions 812, the kinetic energy of the ions contained in the diverging ion beam cones 9141 varies approximately uniformly and the ions distribute almost homogeneously along the vertical extension of the field zones 175.

FIGS. 6B and 6C show the horizontal dopant distributions in the field zones 175 of FIG. 6A in case of no or only weak overlap between neighboring ion beam cones 9141. Line 761 shows the horizontal donator distribution ND(x) and line 762 shows the horizontal net dopant distribution N(x). The field zones 175 are defined by the horizontal acceptor dopant distribution NA(x) of implanted p-type dopants given by line 763, wherein at least in the first field zone sections 1751 the net dopant concentration N(x) gradually decreases from a maximum value Nmax to Nmax/e within a lateral distance Δx of at least 200 nm, e.g., of at least 500 nm. In second field zone sections 1752 in the center of the field zones 175, the net dopant concentration N(x) may be approximately uniform.

FIG. 6B refers to the case with no or only weak overlap between neighboring ion beam cones 9141. Separation regions 131 of a complementary conductivity type laterally separate neighboring field zones 175.

In FIG. 6C the overlapping ion beam cones 9141 form a lightly doped junction termination region that laterally embeds the field zones 175. In the lightly doped junction termination region, which has the conductivity type of the field zones 175, a minimum net dopant concentration Nmin is at most 25%, at most 20% or at most 10% of Nmax.

Figure 7A:
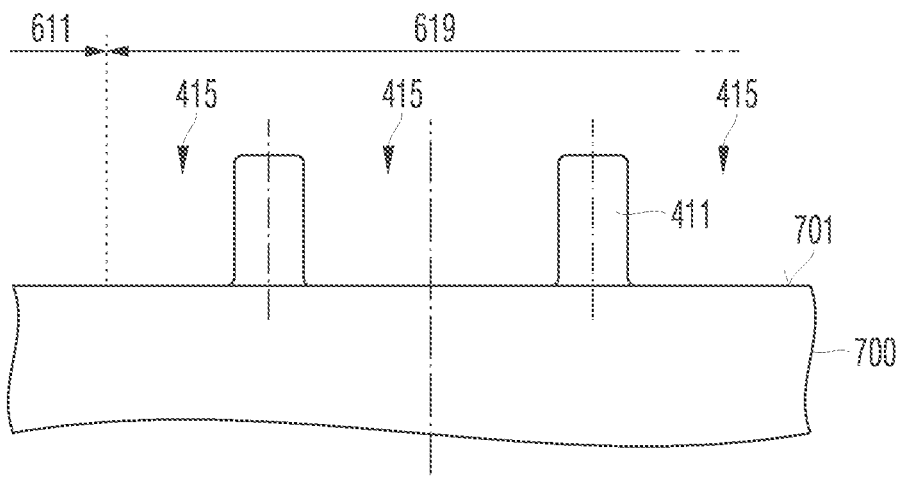
FIG. 7A is a schematic cross-sectional view of a portion of a silicon carbide substrate for illustrating a method of forming laterally spaced field zones with smooth lateral pn junctions according to an embodiment based on a mask reflow, after forming a binary mask structure with steep mask openings.

FIGS. 7A to 11 relate to processes in which a mask with tapering sidewalls laterally modulates the collimated ion beam. FIGS. 7A to 7C illustrate a process using a heat treatment for a reflow process that re-contours slopes of a binary mask structure.

A mask layer is deposited on the substrate surface 701 and patterned by photolithography to form a binary mask structure 411 covering a first portion of a termination region 619 of a device region 610 at approximately uniform thickness and including steep mask openings 415 exposing a second portion of the termination region 619. The binary mask structure 411 may also expose a central region 611 of the device region 610 or may cover the central region 611.

FIG. 7A shows the binary mask structure 411 including one or more steep mask openings 415 with almost vertical sidewalls within the termination regions 619. According to an embodiment one grid-shaped steep mask opening 415 per device region 610 may be formed, wherein the steep mask opening 415 laterally separates columnar portions of the binary mask structure 411 in the termination region 619. According to other embodiments, one, two, or more separated steep mask openings 415 may surround the central region 611 such that separated portions of the binary mask structure 411 form closed frames around the central region 611.

The binary mask structure 411 may include a material with well-defined reflow properties at comparatively low temperatures, e.g., below 800° C. such as doped silicate glass, e.g., PSG (phosphorous silicate glass), BSG (boron silicate glass), BPSG (boron phosphorous silicate glass) or FSG (fluorine silicate glass).

The binary mask structure 411 is subjected to a heat treatment at a temperature at which the binary mask structure 411 starts to reflow and the sidewalls of the steep mask openings 415 start to degrade. The heat treatment is terminated after a section of the mask material, in which the thickness of the mask material is not uniform, reaches a target width. After the mask reflow, ion beam implantation through the resulting reflow mask 421 introduces dopants through the main surface 701 into the SiC substrate 700, wherein separated field zones 175 are formed laterally spaced from one another between the main surface 701 and a drift layer 730 and wherein the reflow mask 421 modulates the lateral dopant distribution in the plane of the main surface 701.

Figure 7B:
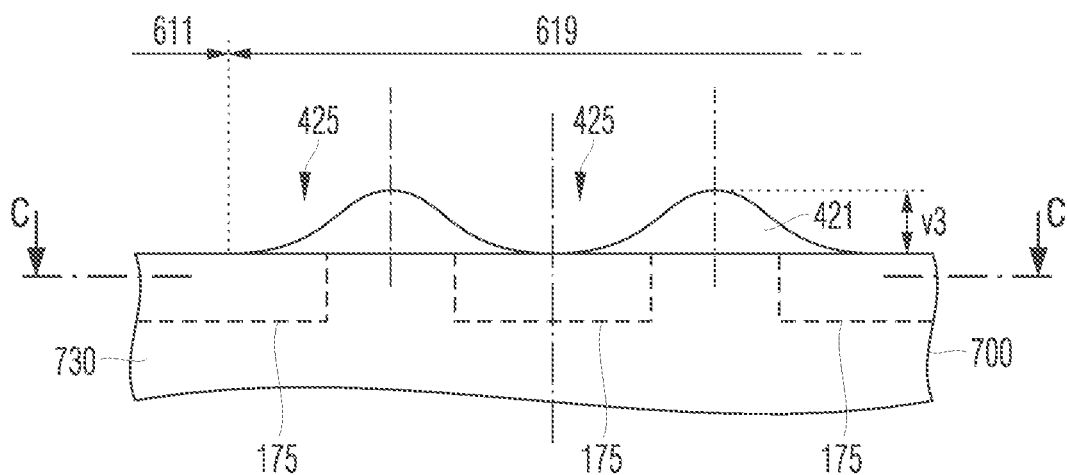
FIG. 7B shows the silicon carbide substrate portion of FIG. 7A, after the mask reflow.

As illustrated in FIG. 7B the reflow of the binary mask structure 411 of FIG. 7A results in a reflow mask 421 including tapering mask grooves 425. In the illustrated embodiment, the mask grooves 425 are mask openings exposing sections of the main surface 701. According to other embodiments, a thin layer of the mask material may cover the main surface 701 at the bottom of the mask grooves 425. In tapering sections of the reflow mask 421, a thickness of the reflow mask 421 decreases from a maximum vertical extension v3 to v3/e across a lateral distance of at least 200 nm, e.g., of at least 500 nm.

Figure 7C:
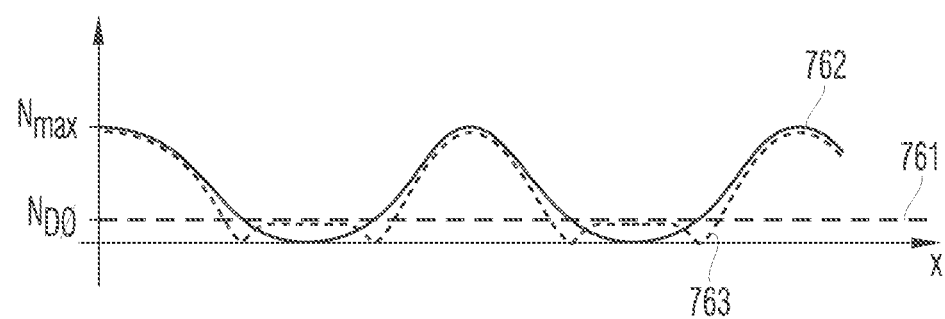
FIG. 7C is a schematic diagram illustrating a lateral net dopant distribution in the silicon carbide substrate along line C-C of FIG. 7B.

FIG. 7C shows the horizontal dopant distribution in the field zones 175 of FIG. 7B. The field zones 175 may be defined by the horizontal acceptor distribution of implanted p-type dopants given by line 762, wherein in at least a part of the first field zone sections 1751 the horizontal net dopant concentration N(x) shown by line 763 gradually decreases from a maximum value Nmax to Nmax/e per at least 200 nm, e.g., per at least 500 nm.

FIGS. 8 to 11 relate to processes using sub-resolution patterns on a reticle for the exposure of a photosensitive layer deposited on the main surface of a SiC substrate.

Figure 8:
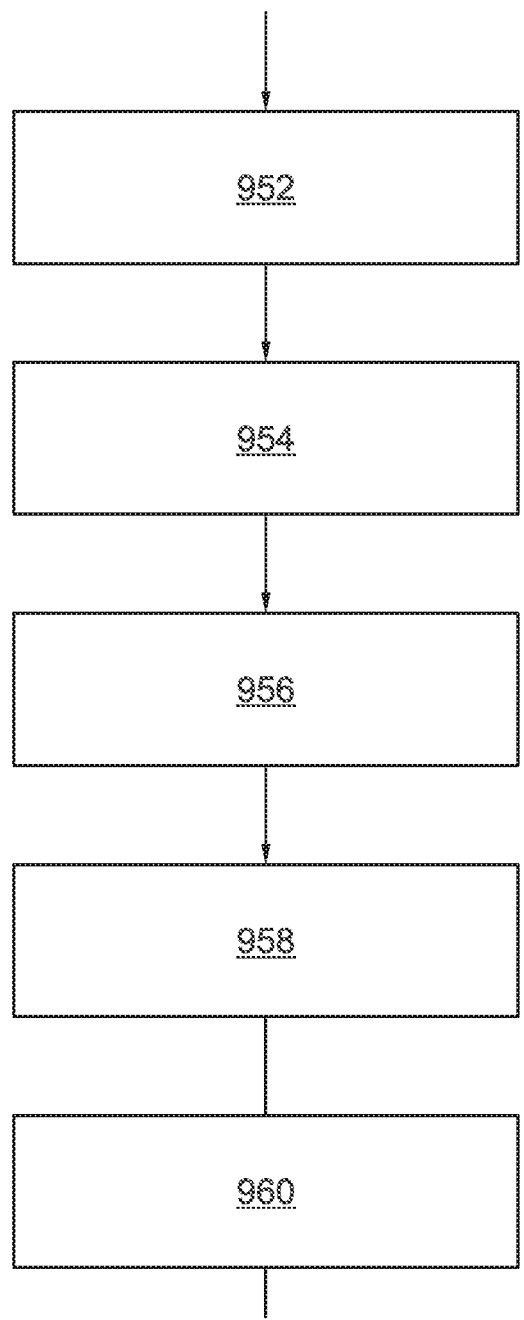
FIG. 8 is a schematic flowchart illustrating a method of manufacturing a semiconductor device with a termination structure according to an embodiment using a reticle with sub-lithographic mask features.

FIG. 8 relates to a method of manufacturing a semiconductor device. A reticle is provided that may include at least two first regions and a second region between the two first regions (952). Each of the first regions includes first transparent areas and first opaque areas. A lateral distance between the two first regions is greater than a width of the first opaque areas, in particular a respective width of each of the first opaque areas.

The lateral distance of the two first regions may be an edge-to-edge distance, that is to say, a closest distance between respective outer edges of the two first regions. In one example, only the second region may be positioned between the two first regions. In this case, the lateral distance of the two first regions may correspond to the width of the second region. The width of each of the first opaque areas may be smaller than the width of the second region.

A SiC substrate and a photosensitive layer on a main surface of the SiC substrate may be provided (954). The photosensitive layer is exposed to an exposure radiation that passes the reticle. Portions of the exposure radiation passing neighboring first transparent areas may expose overlapping areas of the photosensitive layer (956).

The photosensitive layer may be a photoresist. The photoresist may be a so-called positive photosensitive layer (e.g., a positive photoresist) or a so-called negative photosensitive layer (e.g., a negative photoresist). The photosensitive layer may be structurable by developing the photosensitive layer, e.g. in a developer solution. In the case of a positive photosensitive layer, portions of the photosensitive layer that have been exposed to the exposure radiation may be selectively removable compared to un-exposed portions of the photosensitive layer. Vice versa, in the case of a negative photosensitive layer, portions of the photosensitive layer that have not been exposed to the exposure radiation (i.e., un-exposed portions of the photosensitive layer) may be selectively removable compared to exposed portions of the photosensitive layer.

Even though some concepts herein are described in connection with a positive photosensitive layer, it will be appreciated that the concepts are also applicable to a negative photosensitive layer. For this, it may be required to change all opaque areas of the reticle to transparent areas and vice versa all transparent areas of the reticle to opaque areas. Further adjustments with regard to lateral dimensions of the opaque and/or the transparent areas may be required due to different sensitivity of a negative photosensitive layer compared to a positive photosensitive layer.

After exposure, the photosensitive layer may be developed (958). By the development, exposed portions of the photosensitive layer may be selectively removed compared to un-exposed portions of the photosensitive layer, or vice versa. The photosensitive layer may then form an implant mask, e.g. for implanting dopants (e.g. n-type or p-type dopants) into the SiC substrate. The dopants in the SiC substrate may be part of or may form at least one dopant region or doped region in the SiC substrate.

Transparent areas show substantially higher transmittance for the exposure radiation than opaque areas. The opaque areas may nearly completely absorb and/or reflect the exposure radiation. For example, the transparent areas may have a transmittance of at least 70%, for example at least 80%, for the exposure radiation. The opaque areas may have a transmittance of at most 70%, for example at most 50%, for the exposure radiation.

The width of the first opaque area is measured between neighboring transparent areas along a line orthogonal to a transition between a first region and the directly adjoining second region.

For example, the reticle extends along a main extension plane of the reticle, wherein the main extension plane of the reticle is spanned by lateral directions of the reticle. A thickness of the reticle in a vertical direction of the reticle, which runs perpendicular to the lateral directions of the reticle, may be small compared to the extension of the reticle along the main extension plane of the reticle. The same applies, mutatis mutandis, to the SiC substrate, wherein a main surface of the SiC substrate extends along lateral directions of the SiC substrate, which are perpendicular to a vertical direction of the SiC substrate. A width or a distance is typically measured along at least one of the lateral directions. A thickness or a height is typically measured along the vertical direction.

The reticle may be provided above the SiC substrate. For example, the reticle and/or the SiC substrate may be provided such that the main extension plane of the reticle and the main extension plane of the SiC substrate may run substantially parallel to each other, e.g., enclose an angle of at most 10° or at most 4°.

The exposure radiation may be provided in the form of an illuminating beam. Each of the portions of the exposure radiation passing neighboring first transparent areas may be a partial beam of the illuminating beam. With the partial beams of the illuminating beam overlapping in the photosensitive layer, the first transparent areas and the first opaque areas in the first regions form a sub-resolution pattern.

If the photosensitive layer is exposed to exposure radiation of a given wavelength, a sub-resolution pattern optically diffracts the exposure radiation to an extent such that the geometrical information of the sub-resolution pattern is lost. With the loss of the geometrical information about the sub-resolution pattern, the latent image in the exposed photosensitive layer does not contain sufficient information to reconstruct the sub-resolution pattern. Instead, the intensity of the transmitted exposure radiation is modulated by the dimensions and ratio of transparent and opaque areas such that the latent image predominantly contains information about the ratio of transparent and opaque areas of the sub-resolution pattern.

In a sub-resolution pattern, at least one lateral dimension of the transparent areas and/or the opaque areas of the sub-resolution pattern and/or a sum of the lateral dimensions of the transparent and the opaque areas along at least one lateral direction is below a resolution limit. The resolution limit may depend on the exposure wavelength of the illuminating beam as well as on optical properties of an exposure system used for exposure of the photosensitive layer. The resolution limit may further depend on properties of the photosensitive layer, such as, for example, a sensitivity of the photosensitive layer to the illuminating beam. For example, for an exposure wavelength of 365 nm, the resolution limit may be 350 nm.

The energy of a partial beam that passes a transparent area may distribute over a horizontal area of the photosensitive layer that is larger than the horizontal area of the transparent area. The exposure may be performed such that in the areas of the photosensitive layer exposed by the partial beams passing through the transparent areas in the first regions during development, only an upper portion of the photosensitive layer is removed and a lower portion of the photosensitive layer remains on the semiconductor substrate.

For example, the development rate of a thin photosensitive layer may be a function of the exposure dose. In the thin photoresist the penetration depth of the exposure light is higher than the resist film thickness even in areas exposed through the sub-resolution pattern.

According to another example, the penetration depth in a thick photoresist layer may be a function of the exposure dose. In areas of the thick photosensitive layer exposed through the sub-resolution pattern the penetration depth may be lower than the thickness of the photosensitive layer such that only an upper portion of the photosensitive layer can be removed during development. Typically, a positive photosensitive layer is used as a thick photosensitive layer.

When the photosensitive layer is exposed to exposure radiation of a given wavelength, the sub-resolution pattern optically diffracts the exposure radiation to an extent such that the geometrical information of the sub-resolution pattern is lost. Instead, the dimensions and ratio of transparent and opaque areas modulate the intensity of the transmitted exposure radiation. For example, illumination through the sub-resolution pattern may result in a horizontally unstructured exposure of the concerned portion of the photosensitive layer. The image of the sub-resolution pattern is blurred to a degree such that at the latest after a development of the photosensitive layer, the photosensitive layer does not include information about size and position of the sub-resolution pattern of the reticle.

According to an embodiment, in case a mean transmittance in the second region is higher than a mean transmittance in the first regions, a size of the transparent areas may decrease with increasing distance to the second region. In case the mean transmittance in the second region is lower than the mean transmittance in the first regions, a size of the transparent areas may increase with increasing distance to the second region. This embodiment may be typically implemented with a positive photosensitive layer.

According to an alternative embodiment, in case a mean transmittance in the second region is lower than a mean transmittance in the first regions, a size of the transparent areas may decrease with increasing distance to the second region. In case the mean transmittance in the second region is higher than the mean transmittance in the first regions, a size of the transparent areas may increase with increasing distance to the second region. This embodiment may be typically implemented with a negative photosensitive layer.

For the two alternative embodiments described before, the respective size of the transparent areas may show a variation with increasing distance to the second region. The variation of the size may depend (directly or indirectly) on the ratio of the mean transmittance in the second region and the mean transmittance in the first regions. In this context, the size of a transparent area may be lateral extent of the transparent area, e.g. a lateral cross-section of the transparent area. In a resulting resist mask, transitions between rings of different height may be gradual.

An implant mask is formed. Using the implant mask, ions, e.g. dopants, are implanted into the SiC substrate (960). Forming the implant mask includes developing the photosensitive layer. For example, a multi-level resist mask formed from the photosensitive layer may be used to mask an implant that forms dopant regions of different dose and vertical extensions in one single implant step. According to another example, the multi-level resist mask may be used to form a multi-step hard mask and the multi-step hard mask may mask an implant that forms dopant regions of different dose and different vertical extension in one single implant step. In other words, the resist mask may be used as an etch mask for forming a hard mask from a hard mask layer of the SiC substrate, wherein an etch process may image the pattern and contour of the resist mask into a hard mask layer, wherein the hard mask layer may be formed between the SiC substrate and the resist mask and wherein the hard mask may be used as implant mask.

The resist mask or the hard mask may be used to form field zones as described with reference to FIGS. 3B, 4A-4B, 5A-5C, 6B-6C or 7B-7C, by way of example. In particular, in at least one of the field zones the horizontal net dopant concentration N(x) may gradually decrease from a maximum value Nmax to Nmax/e within a lateral distance Δx of at least 200 nm, e.g., per at least 500 nm.

The decrease from Nmax to Nmax/e across the lateral distance Δx may be monotonic, wherein N(x) is entirely non-increasing within the lateral distance Δx. For example, within the lateral distance Δx, N(x) may be strictly decreasing and/or N(x) may be continuously differentiable within the lateral distance Δx. By way of example, N(x) may have one inflexion point within the lateral distance Δx, wherein, starting from Nmax, N(x) falls at increasing rate from Nmax to the point of inflexion and from the point of inflexion N(x) falls at decreasing rate.

According to an embodiment, N(x) may be approximated by the function Nmax*0.5*(1−erf((x−x0)/(σ*sqrt(2)))), wherein σ may be greater 200 nm and x0 indicates the so-called inflection point, which is the lateral position where N(x) has dropped to 0.5*Nmax.

In this context and in the following, "approximated" by the function may mean that the value of N(x) at an arbitrary point may differ by at most ±10%, typically at most ±5%, from a value of the function at the same point.

Figure 9A:
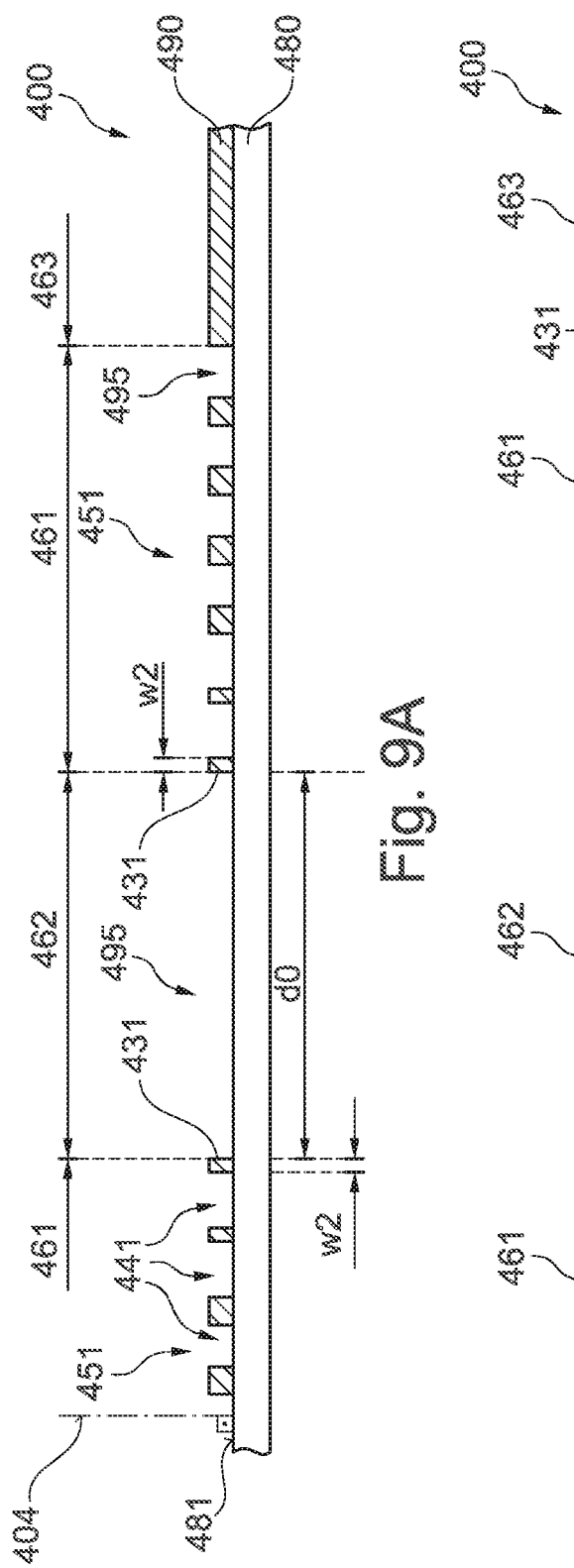
FIGS. 9A and 9B illustrate a schematic plan view and a schematic cross-sectional view of a portion of a reticle with a sub-resolution pattern according to an embodiment.
Figure 9B:
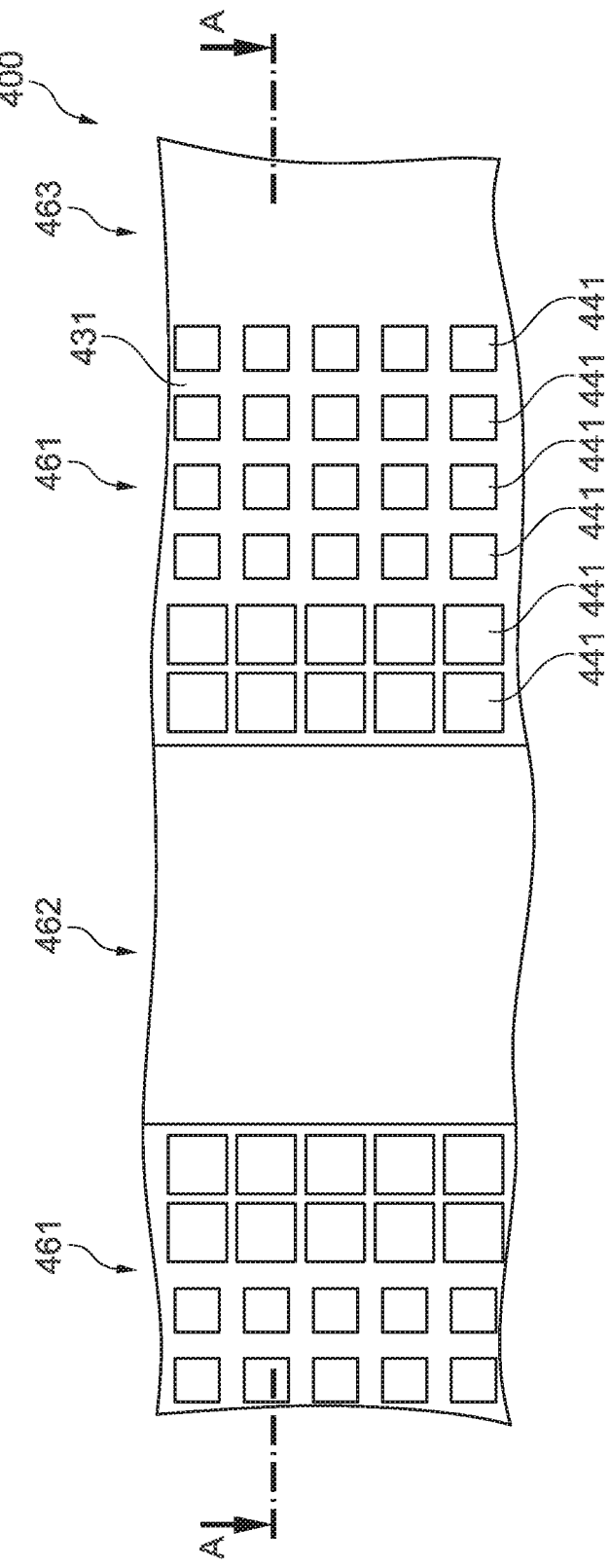

FIGS. 9A and 9B illustrate a portion of a reticle 400. The reticle 400 may include a base substrate 480 that is transparent at an exposure wavelength and a pattern layer 490 on a pattern surface 481 of the base substrate 480. The pattern layer 490 may be a highly reflective and/or absorptive layer with openings 495 that expose the base substrate 480. Regions of the reticle 400 in which the pattern layer 490 covers the base substrate 480 form opaque areas. Regions in which the openings 495 expose the base substrate 480 are transparent areas.

The plane of the pattern surface 481 defines horizontal and lateral directions. A surface normal 404 to the pattern surface 481 defines a vertical direction.

The reticle 400 may include at least two first regions 461 and a second region 462 between the two first regions 461. Each of the first regions 461 includes first transparent areas 441 and first opaque areas 431. The first transparent areas 441 may be polygons with or without chamfered and/or rounded corners, e.g., rectangles such as squares, or circles, ovals, and/or ellipses. The first opaque areas 431 may be connected and may form a grid separating neighboring first transparent areas 441 from each other. Alternatively, the first transparent areas 441 may be connected and may form a grid separating neighboring first opaque areas 431 from each other, wherein the first opaque areas 431 may be polygons with or without chamfered and/or rounded corners, e.g., rectangles such as squares, or circles, ovals, and/or ellipses.

A lateral distance d0 between the two first regions 461 is greater than a width w2 of the first opaque area 431, wherein the width w2 of the first opaque area 431 is a distance between two neighboring transparent areas 441 measured perpendicular to a boundary between the first and the second regions 461, 462.

The first transparent areas 441 and the first opaque areas 431 form a first sub-resolution pattern 451. If exposed to an exposure radiation of a given exposure wavelength, the first sub-resolution pattern 451 diffracts the exposure radiation to an extent that the geometrical information of the sub-resolution pattern is lost.

For example, the sum of at least a smaller one of two orthogonal lateral extensions of the first transparent areas 441 and/or a smaller one of two orthogonal lateral extensions of the first opaque areas 431 may be at most about the wavelength of the exposure radiation. For example, for an exposure wavelength of 365 nm, at least the smaller one of two orthogonal lateral extensions of the first transparent areas 441 is at most 350 nm.

According to the illustrated embodiment the second region 462 may be transparent. According to other embodiments the second region 462 may include a second sub-resolution pattern or the second region 462 may be opaque.

The reticle 400 may include at least one third region 463 in which the mean transparency differs from the mean transparency in the first regions 461 and from the mean transparency in the second regions 462.

In at least one first region 461, an area ratio between transparent areas 441 and opaque areas 431 may change. For example, the area ratio between transparent areas 441 and opaque areas 431 may increase with decreasing distance to a second region 462 with higher mean transparency than the first region 461, e.g., with decreasing distance to a transparent second region 462. In a first region 461 the area ratio between transparent areas 441 and opaque areas 431 may decrease with decreasing distance to a second region 462 with lower mean transparency than the first region 461, e.g., with decreasing distance to an opaque second region 462.

For example, the size of the first transparent areas 441 in the first regions 461 may decrease with increasing distance to the transparent second region 462. As a result, mask portions may have tilted sidewalls, wherein the sidewalls may include crooked, curved, concavely bowed, convexly bowed and/or straight sections.

Figure 9C:
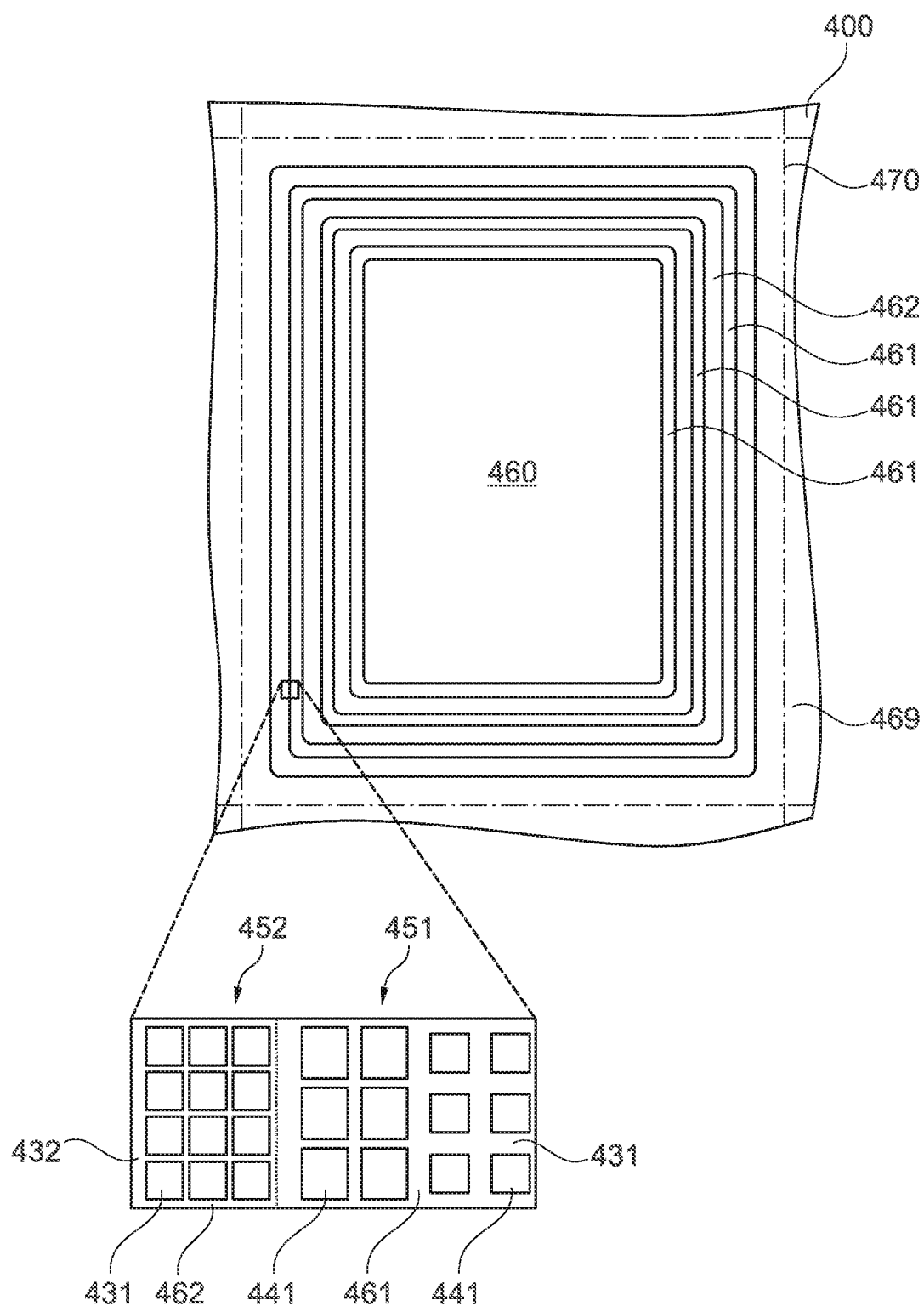
FIG. 9C is a schematic plan view of a portion of a reticle in accordance with a further embodiment.

FIG. 9C shows a plan view of a reticle 400 according to another embodiment. The reticle 400 may include one, two, four or more identical unit patterns 470, wherein each unit pattern 470 may define a junction termination extension of one semiconductor device. Each unit pattern 470 may include a central region 460, at least two first regions 461, at least one second region 462 between two first regions 461, and a reticle edge region 469. The horizontal cross-sectional area of the central region 460 may be a rectangle. However, other cross-sectional areas, e.g. an elliptical shape or a polygonal shape, may be possible. The first regions 461, the second regions 462 and the reticle edge region 469 may form frames, e.g., rectangular frames of different size around the central region 460. The lateral width of each frame may be uniform. The reticle edge regions 469 of the unit patterns 470 may form a grid.

The first regions 461 may include a first sub-resolution pattern 451 with first transparent areas 441 and first opaque areas 431. For example, the first transparent areas 441 may be rectangular openings in the pattern layer 490 of FIG. 1. The first opaque areas 431 may be connected and may form a grid separating neighboring first transparent areas 441 from each other. According to at least another example, the first opaque areas 431 may be rectangular columns and the first transparent areas 441 may be connected and may form a grid separating neighboring first opaque areas 431 from each other.

A mean transmittance in the central region 460 may differ from the mean transmittance in the first regions 461 and from the mean transmittance in the second region 462. The central region 460 may be transparent. The reticle edge region 469 may be opaque.

According to the illustrated embodiment, the second region 462 may include a second sub-resolution pattern 452 that may include second transparent areas 442 and second opaque areas 432. For example, the second sub-resolution pattern 452 may include rectangular second transparent areas 442 and second opaque areas 432 that form a grid separating neighboring second transparent areas 442 from each other.

An area ratio between second transparent areas 442 and second opaque areas 432 in the second region 462 may differ from an area ratio between first transparent areas 441 and first opaque areas 431 in the first region 461. For example, the first transparent areas 441 and the second transparent areas 442 may differ in size.

According to an embodiment the reticle 400 may include more than two first regions 461, wherein a distance between neighboring first regions 461 may decrease with increasing distance to the central region 460 and/or a width of the first regions 461 may increase with increasing distance to the central region 460.

According to another embodiment the reticle 400 may include more than two first regions 461, wherein a distance between neighboring first regions 461 may increase with increasing distance to the central region 460 and/or a width of the first regions 461 may decrease with increasing distance to the central region 460.

The first transparent areas 441 may be formed along lines that run parallel to boundary lines between adjoining first regions 461 and second regions 462. In case the mean transmittance in the second region 462 is higher than the mean transmittance in the first regions 461, an area ratio, e.g., the size of the first transparent areas 441 may decrease with increasing distance to the second region 462. In case the mean transmittance in the second region 462 is lower than the mean transmittance in the first region 461, an area ratio, e.g., the size of the first transparent areas 441 may increase with increasing distance to the second region 462.

Figure 10:
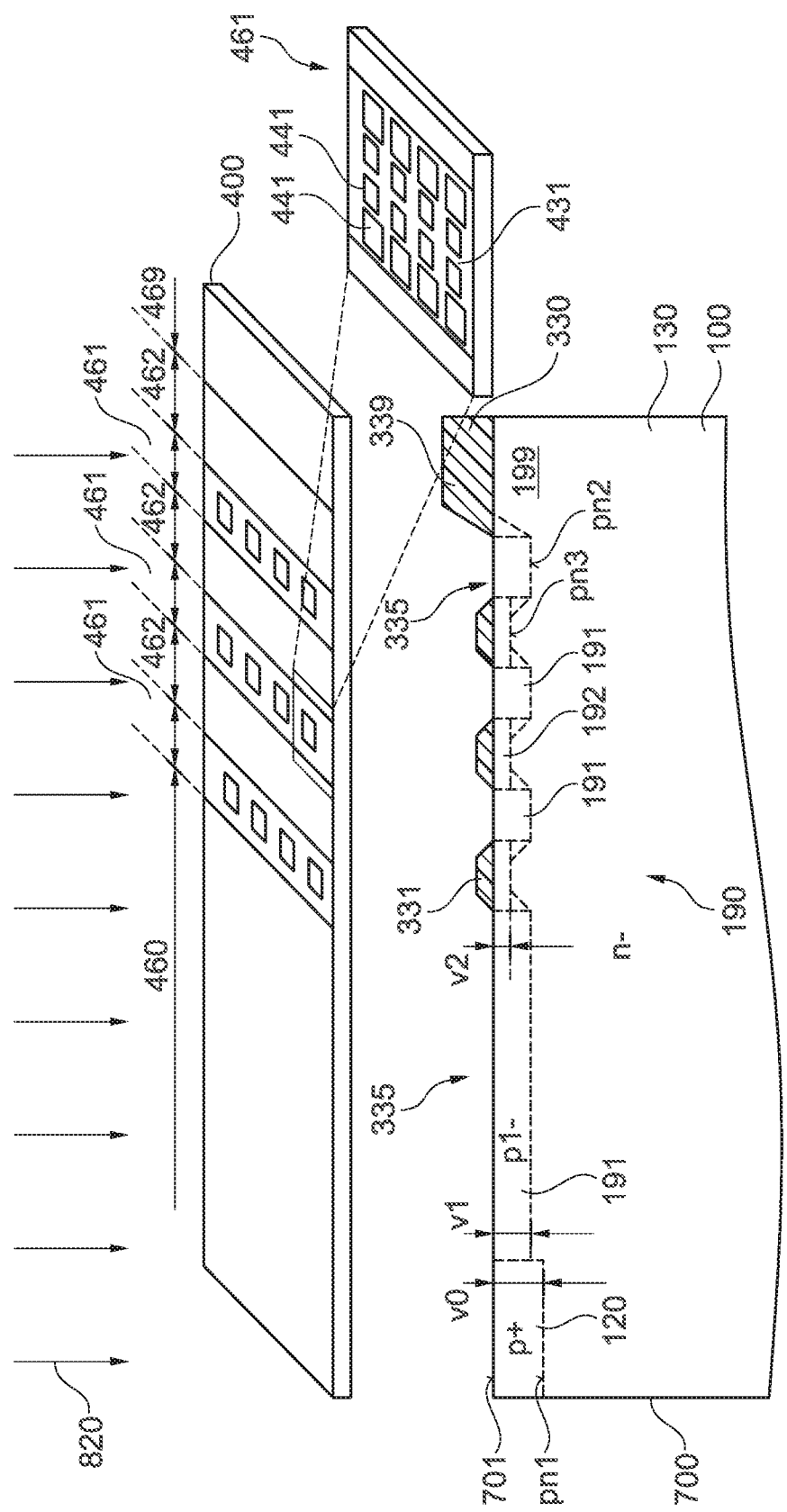
FIG. 10 is a schematic illustration combining a perspective view of a reticle with a corresponding cross-sectional view of a portion of a semiconductor device according to an embodiment related to a reticle with a sub-resolution pattern including openings of different width.
Figure 11:
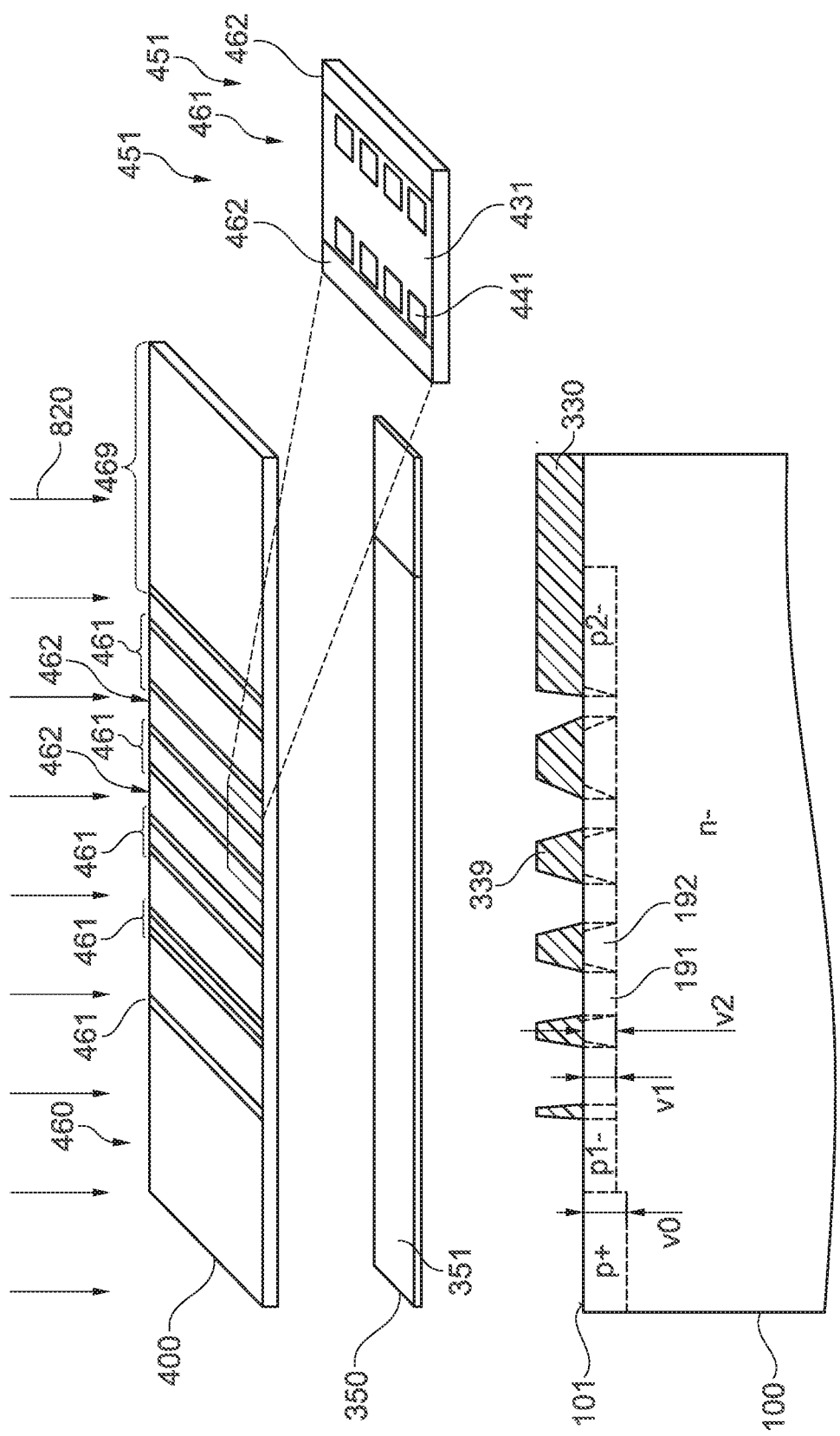
FIG. 11 is a schematic illustration combining perspective views of a reticle and a binary implant mask with a vertical cross-sectional view of a portion of a semiconductor device according to another embodiment.

FIGS. 10 and 11 combine perspective views of reticles 400, which include sub-resolution patterns, with corresponding cross-sectional views of respective SiC substrates 700 with junction termination extensions 190 for semiconductor devices.

In a plan view (not shown in the figures), the SiC substrate 700 or the semiconductor device may have the same or a similar shape than the reticle. For example, the semiconductor device may have a rectangular shape, an elliptical shape or a polygonal shape. The junction termination extension 190 may run along an outer perimeter of the semiconductor device.

Forming the junction termination extensions 190 may include ion implantation into the SiC substrate 700 through a resist mask 330. Formation of the resist mask 330 may include an exposure process that uses the reticle 400.

In FIG. 10 the reticle 400 includes first regions 461 and second regions 462. The second regions 462 separate neighboring first regions 461 from each other and separate the outermost first region 461 from a reticle edge region 469. The first regions 461, the second regions 462 and the edge region 469 surround a central region 460. The central region 460 and the second regions 462 may be transparent. The edge region 469 may be opaque. The first regions 461 may include a first sub-resolution pattern 451 with first transparent areas 441 and first opaque areas 431, wherein the first opaque areas 431 may be connected and may separate the first transparent areas 441 from each other and from the adjoining regions. The first opaque areas 431 and/or the first transparent areas 441 may have at least one lateral extension smaller than a resolution limit of an exposure radiation 820.

Portions of the exposure radiation 820 passing the reticle 400 may be used to form a resist mask 330 with resist mask openings 335 corresponding to the central region 460 and the second regions 462, with a thick resist mask portion 339 corresponding to the edge region 469 of the reticle 400 and with thin resist mask portions 331 defined by the first regions 461 of the reticle 400.

When the resist mask 330 is used as an implant mask, the thick resist mask portion 339 may completely block the implant and the thin resist mask portions 331 may partly block the implant, wherein dose and range of the effectively implanted ions in the SiC substrate 700 are reduced. The implant may include a plurality of implants at different acceleration energies. The thin resist mask portions 331 may be sufficiently thick to completely block at least the implant with the lowest acceleration energy. The thin resist mask portions 331 may be sufficiently thin to let pass at least the implant with the highest acceleration energy.

Each unit pattern of the reticle 400 may correspond to a semiconductor device formed from a portion of the SiC substrate 700. A silicon carbide body 100 of the semiconductor device includes a drift region 130. In a central portion 610, the silicon carbide body 100 may include an emitter region, e.g., an anode/body region 120 formed between the main surface 701 and the drift region 130. The anode/body region 120 may include the anode region of a SiC diode or the body regions of a SiC power transistor, wherein the SiC power transistor includes a plurality of transistor cells electrically connected in parallel.

The emitter region 120 and the drift region 130 form one or more first pn junctions pn1, which may include the diode junction of a SiC diode or the body/drain junction(s) of the transistor cells of an SiC power transistor. A junction termination extension 190 may include first doped regions 191 and second doped regions 192.

The first doped regions 191 may be formed between the main surface 701 and the drift region 130 in the vertical projection of the resist mask openings 335. The first doped regions 191 and the drift region 130 may form second pn junctions pn2. Second doped regions 192 may be formed between the main surface 701 and the drift region 130 below the thin resist mask portions 331. The second doped regions 192 and the drift region 130 may form third pn junctions pn3. A termination edge region 199 below the thick resist mask portion 339 may be left unaffected by the ion implant.

A vertical extension v2 of the second doped regions 192 may be smaller than a vertical extension v1 of the first doped regions 191. A dopant concentration in the second doped regions 192 may be lower than in the first doped regions 191. The vertical extension v1 of the first doped regions 191 may be smaller or equal than a vertical extension v0 of the body/anode region 120. A maximum dopant concentration in the body/anode region 120 is higher than in the first doped regions 191. The first doped regions 191 and the second doped regions 192 may be in contact with the main surface 701.

According to an embodiment, the drift region 130 is n-doped and the body/anode region 120, the first doped regions 191 and the second doped regions 192 are p-doped. According to other embodiments the drift region 130 may be p-doped and the body/anode region 120, the first doped regions 191 and the second doped regions 192 may be n-doped.

In the illustrated embodiment, the first doped regions 191 may form field zones, e.g., closed, p-doped frame-like field rings around the body/anode region 120 and contribute to mitigation of the electric field strength along the main surface 701. The first doped regions 191 may reduce susceptibility to surface charges that may accumulate in dielectric structures deposited above the silicon carbide body 100 and that may impact the electric field distribution in the junction termination extension 190.

The lower doped second doped regions 192 may reduce the sensitivity against lithographic alignment fluctuations, may locally reduce the electric field strength, and/or may reduce the sensitivity against surface charges.

Since the first and the second doped regions 191, 192 are defined by one single mask, the impact on the electric field strength does not depend on the degree of a misalignment between two lithographic processes.

In the first region 461 an area ratio between first transparent areas 441 and first opaque areas 431 may decrease with increasing distance to a transparent second region 462.

In FIG. 10 a size of the first transparent areas 441 in the first regions 461 decreases with increasing distance to a transparent second region 462.

According to another embodiment a width of the first opaque areas 431 may increase with increasing distance to the transparent second region 462. According to a further embodiment, both a size of the first transparent areas 441 decreases and a width of the first opaque areas 431 increases with increasing distance to the transparent second region 462.

For example, the first transparent areas 441 may be arranged in lines parallel to a transition between the first region 461 and the second region 462, wherein the transparent areas 441 assigned to the same line have the same size. The transparent areas 441 in a first line closest to the second region 462 may have a first size. The transparent areas 441 in an n-th line may have a second size smaller than the first size. The transparent areas 441 in lines between the first line and the n-th line may have the first size, the second size or a size between the first size and the second size. For example, the first two or three lines may include first transparent areas 441 of the first size and starting from the third or from the fourth line the first transparent areas 441 may have the second size.

Alternatively or in addition the width of the first opaque areas 431 may change from a first width between the transparent areas 441 of the first line and the second region 462 to a second width of the first opaque areas 431 between the first transparent areas 441 of the n-th line and the (n−1)-th line. The width of first opaque areas 431 between the first line and the (n−1)-th line may have the first width, the second width or a width between the first width and the second width.

As a result, the thin resist mask portions 331 may have gentle inclined, e.g., tilted sidewalls. The first regions 461 may form field zones, in particular filed rings as described above, wherein in the field zones the horizontal net dopant concentration N(x) may gradually decrease from a maximum value Nmax to Nmax/e per at least 200 nm, e.g., per at least 500 nm.

According to a further embodiment, a sub-resolution pattern may also be formed in the edge region 469 along a boundary line between the edge region 469 and the outermost second region 462. The sub-resolution pattern in the edge region 469 may result in a thick resist mask portion 339 with an oblique sidewall towards the adjoining resist mask opening 335.

FIG. 11 refers to an embodiment based on two implants for forming a junction termination extension 190, wherein a first implant uses a greyscale resist mask 330 and a second implant uses a binary resist mask. The second implant may be performed prior to or after the first implant.

The greyscale resist mask 330 may be formed as described above by exposure of a photosensitive layer with a reticle 400 that includes sub-lithographic features. For example, the reticle 400 may include transparent second regions 462 between first regions 461, wherein the first regions 461 include first sub-resolution patterns 451 only along boundary lines between the first regions 461 and the second regions 462 such that the first sub-resolution patterns are effective only along the transitions to the second regions 462. In the rest, each first region 461 may include a first opaque area 431 with a width greater than a width of the first transparent areas 441 and greater than the resolution width. The resulting resist mask 330 may include thick resist mask portions 339 with tapering sidewalls.

The binary resist mask may result from exposure with a binary reticle 350. The binary reticle 350 may include a central opening 351 including the central region 460, the first regions 461 and the second regions 462 of the reticle 400. A low-dose implant may define the dopant dose of the second doped regions 192 and may raise the doping dose in the anode/body region 120 and in the first doped regions 191.

The binary resist mask may facilitate a variable definition of the vertical extension v1 of the first doped regions 191 and a vertical extension v2 of the second doped regions 192. For example, v1 may be smaller than v2, may be equal to v2 or may be greater than v2. The doping of the second doped regions 192 may be decoupled from the doping of the first doped regions 191.

The tapering sidewalls of the thick resist mask portions 339 facilitate smooth lateral transitions between the first doped regions 191 and the second doped regions 192. Local electric field peaks along edges of the first doped regions 191 may be reduced. A vertical extension v1 of the first doped regions 191 may be selected independently from a vertical extension v2 of the second doped regions 192.

Figure 12A:
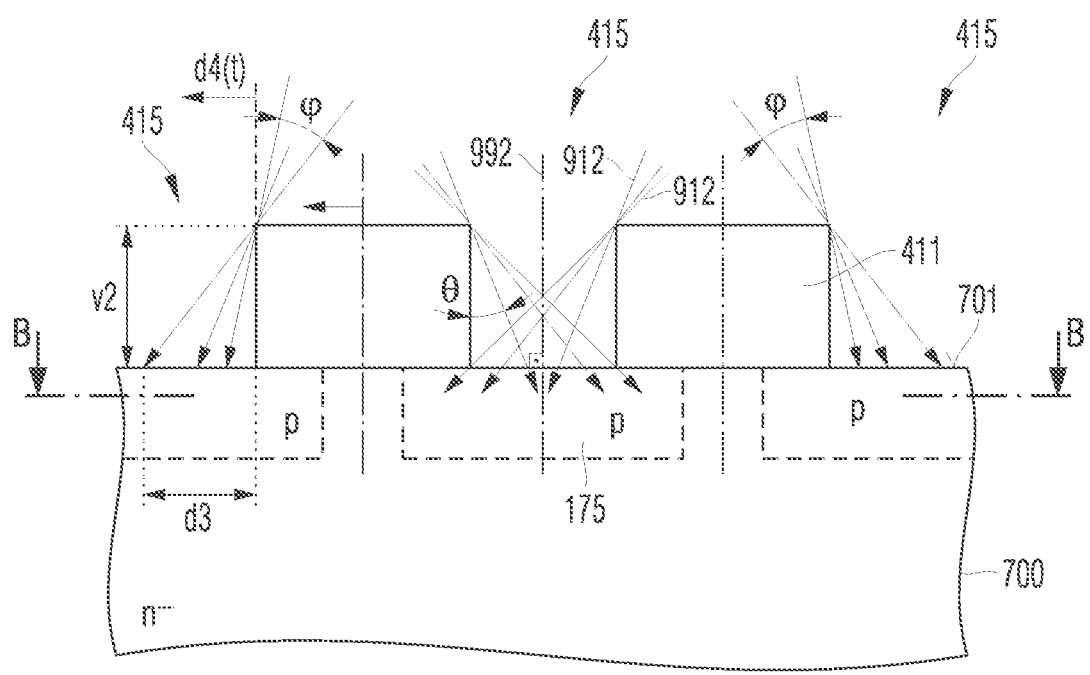
FIG. 12A is a schematic cross-sectional view of a portion of a silicon carbide substrate for illustrating a method of forming laterally spaced field zones with smooth lateral pn junctions according to an embodiment based on a combination of a tilt of the silicon carbide substrate with respect to a beam axis of an ion beam and a rotational movement.
Figure 12B:
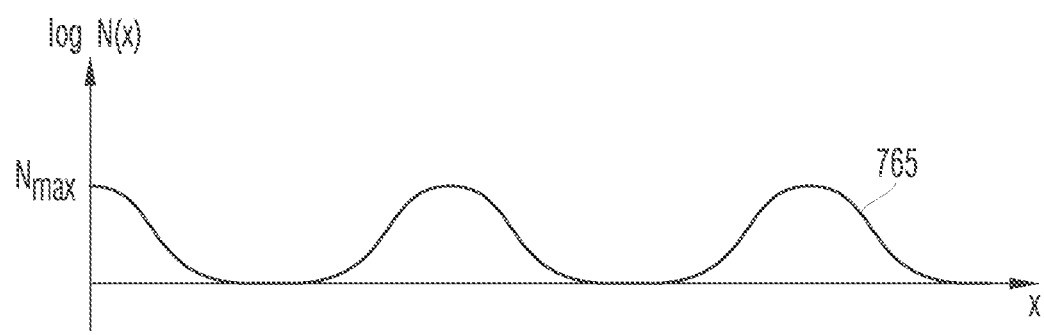
FIG. 12B shows a simplified diagram of the lateral net dopant distribution in the silicon carbide substrate along line B-B in FIG. 12A.

FIGS. 12A and 12B relate to a method using a binary mask structure 411 with steep sidewalls for partially shadowing the main surface 701 against a collimated ion beam 912, wherein a beam axis 992 of the collimated ion beam 912 is tilted to the normal 704 onto the main surface 701 by a tilt angle φ. The binary mask structure 411 in combination with a relative movement between the collimated ion beam 912 and the SiC substrate 700 shadows different regions against the collimated ion beam for different periods of times and in this way modulates the lateral density distribution entering the SiC substrate 700 through the main surface 701.

A binary mask structure 411 with steep mask openings 415 is formed on the main surface 701 of a SiC substrate 700 as described with reference to FIG. 7A.

The SiC substrate 700 including the binary mask structure 411 is positioned in an implantation apparatus 900 as illustrated in FIG. 3A in a way that the normal 704 of the SiC substrate 700 is tilted to the beam axis 992 of the collimated ion beam 912 by a tilt angle φ, wherein the tilt angle φ may be greater than 10°, e.g., about 20°. During the implant, the SiC substrate 700 rotates at least once around a vertical center axis tilted to the normal onto the main surface 701 at a constant tilt angle φ. During one turn a plane spanned by the beam axis 992 of the collimated ion beam 912 and the vertical center axis of the SiC substrate 700 rotates once around the vertical center axis.

During a half turn, an angle θ between a vertical sidewall of the binary mask structure 411 averted from the collimated ion beam 912 and the effective beam axis 992 continuously changes from 0° to the tilt angle φ and back to 0°. Accordingly, the length of the shadow of the binary mask structure 411 onto the main surface 701 at the averted side gradually increases from 0 to a maximum value d3 defined by a vertical extension v2 of the binary mask structure 411 and the tilt angle φ according to equation (3):

$$d3 = v2 * \tan(\varphi), \quad (3)$$

During the half turn a distance d4 between the trace of the ion beam on the main surface 701 and the shadowed sidewall as a function of time t and rotational frequency co is represented by equation (4):

$$d4(t) = d3 * \sin(\Psi t) \quad (4)$$

The implant may be performed with one or more full turns at the same tilt angle φ or at different tilt angles.

In FIG. 12B line 765 approximates the horizontal net dopant distribution N(x) in the field zones 175 of FIG. 12A. The net dopant concentration N(x) gradually decreases from a maximum value Nmax to Nmax/e per at least 200 nm, e.g., per at least 500 nm.

The method described with reference to FIGS. 12A and 12B may include guiding, for each partial section of the main surface 701 the collimated ion beam 912 with respect to the SiC substrate 700 in a way that the tilt angle φ between the beam axis 992 is constant for each complete turn.

Figure 13A:
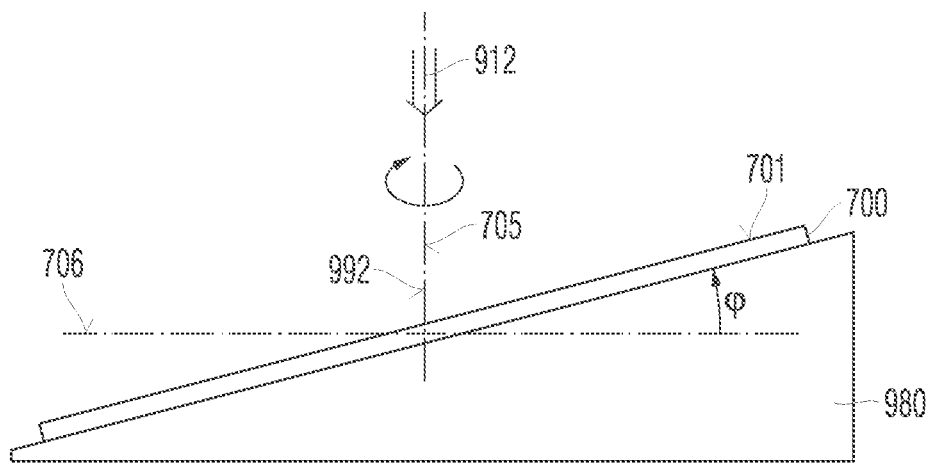
FIG. 13A is a schematic side view of a silicon carbide substrate in a first position for illustrating a method of forming laterally spaced field zones with smooth lateral pn junctions according to another embodiment related to a toggle plate.
Figure 13B:
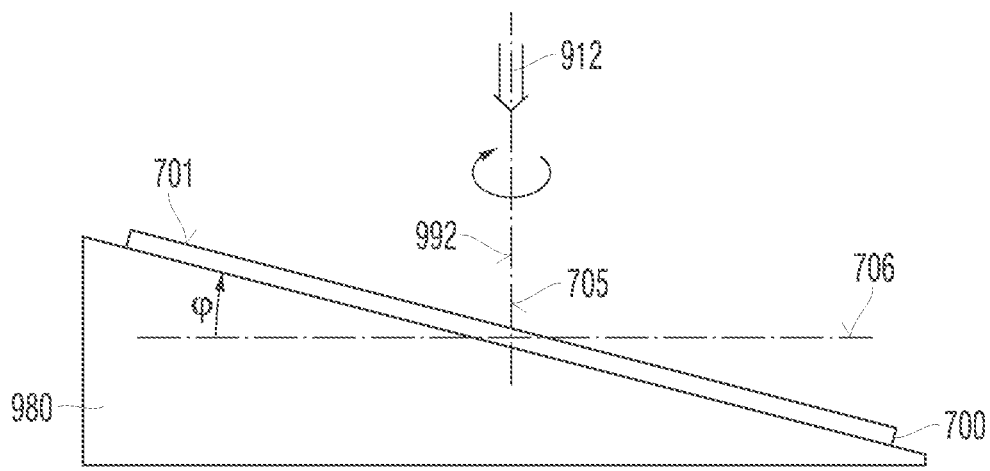
FIG. 13B is a schematic side view of the silicon carbide substrate of FIG. 13A in a second position after a half turn.

FIGS. 13A to 13B relate to an embodiment concerning an ion implantation apparatus in which the beam axis of the ion beam is fixed or movable across one single horizontal direction.

FIG. 13A shows a substrate carrier 980 holding a SiC substrate 700 tilted at a tilt angle φ against a plane 706 orthogonal to the beam axis 992 of a collimated ion beam 992 at the start of an implantation process. During the implant, the substrate carrier 980 with the tilted SiC substrate 700 rotates around a rotational axis 705 parallel to the beam axis 992.

FIG. 13B shows the substrate carrier 980 and the SiC substrate 700 after a half turn with respect to the position in FIG. 13A. A binary mask structure with steep mask openings formed on the main surface 701 may result in laterally modulated dopant distributions as discussed with reference to FIGS. 12A to 12C.

Figure 14A:
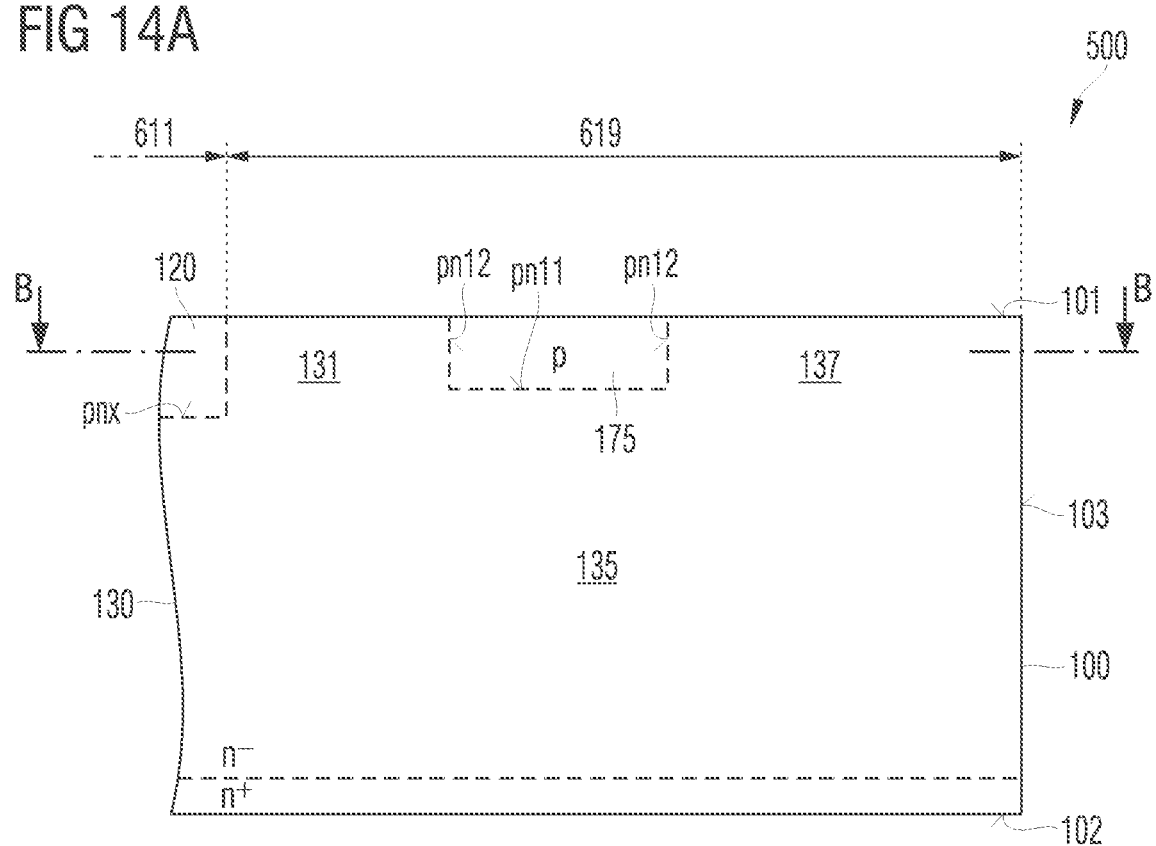
FIG. 14A is a schematic vertical cross-sectional view of a portion of a silicon carbide device including a field zone with a horizontal net dopant distribution N(x) falling from a maximum value Nmax to Nmax/e within a distance of at least 100 nm according to an embodiment.

FIG. 14A shows a portion of a semiconductor device 500 that may be or may include a power semiconductor diode, an IGFET (insulated gate field effect transistor), for example, an MOSFET (metal oxide semiconductor FET) in the usual meaning including FETs with metal gates as well as FETs with gates from a semiconductor material, an IGBT (insulated gate bipolar transistor) or an MCD (MOS controlled diode), by way of example.

The semiconductor device 500 includes a semiconductor portion 100 with a first surface 101 at a front side and a second surface 102 on the back opposite to the first surface 101. The semiconductor portion 100 is of silicon carbide (SiC). A vertical extension of the semiconductor portion 100 between the first surface 101 and the second surface 102 may be in a range of several hundred nm to several hundred μm.

A normal to the first surface 101 defines a vertical direction and directions parallel to the first surface 101 are horizontal directions which are also referred to as lateral directions in the following.

A drift structure 130 in the semiconductor portion 100 includes a drift zone 135. In a blocking state of the semiconductor device 500, a main portion of a blocking voltage applied between a first load electrode at the front side and a second load electrode on the rear side drops across the drift zone 135. The drift zone 135 has a first conductivity type and may extend across a complete horizontal cross-sectional plane of the semiconductor portion 100. A mean dopant concentration in the drift zone 135 may be uniform along the vertical direction. For example, a mean dopant concentration in the drift zone 135 may be in a range from 1E14 cm$^{-3}$ to 5E16 cm$^{-3}$, for example, in a range from 1E15 cm$^{-3}$ to 3E16 cm$^{-3}$.

The drift structure 130 further includes a heavily doped base portion 139 between the drift zone 135 and the second surface 102. A conductivity type of the base portion 139 may be the same as that of the drift zone 135 or may be the complementary conductivity type or the base portion 139 may include doped zones of both conductivity types extending from the drift zone 135 to the second surface 102. Along the second surface 102 a dopant concentration of the base portion 139 may be sufficiently high to form a low-resistive contact, for example, an ohmic contact, with a metal structure adjoining the second surface 102 and forming the second load electrode.

A central region 611 of the semiconductor portion 100 includes an active area of the semiconductor device 500, wherein the active area may include an anode/body region 120 forming a main pn junction pnx with the drift structure 130. The anode/body region 120 may be an anode region of a power semiconductor diode or may include body regions of transistor cells of a power semiconductor switch, e.g., an IGFET or an IGBT. A termination region 619 surrounds the central region 611 and separates the central region 611 from a side surface 103 of the semiconductor portion 100.

At the front side, the termination region 619 includes a termination structure 170 across which the blocking voltage drops laterally. The termination structure 170 includes field zones 175 between the first surface 101 and the drift structure 130, e.g., between the first surface 101 and the drift zone 135. The field zones 175 have the second conductivity type and form first pn junctions pn1 with the drift zone 135. A maximum vertical extension v1 of the field zones 175 may be in a range from 200 nm to 2 μm, for example in a range from 400 nm to 1000 nm. A mean dopant concentration in the field zones 175 may be approximately uniform along the vertical direction.

The first pn junctions pn1 include horizontal sections pn11 parallel to the first surface 101 and may include vertical sections pn12 orthogonal to the first surface 101. The horizontal section pn11 may be completely planar and may extend in one single geometrical plane parallel to the first surface 101.

The field zones 175 may be embedded in a junction termination zone of the same conductivity type. According to the illustrated embodiment the drift structure 130 includes separation regions 131 of the conductivity type of the drift zone 135, wherein the separation regions 131 extend from the first surface 101 to the drift zone 135 and laterally separate the field zones 175 from each other and/or from other doped regions of the same conductivity type, e.g., from an anode/body region 120 in the central region 611.

Along the side surface 103 the drift structure 130 may include an edge portion 137 of the conductivity type of the drift zone 135 and extending from the first surface 101 to the drift zone 135. The edge portion 137 conveys the electric potential from the rear to the front side of the semiconductor portion 100.

Figure 14B:
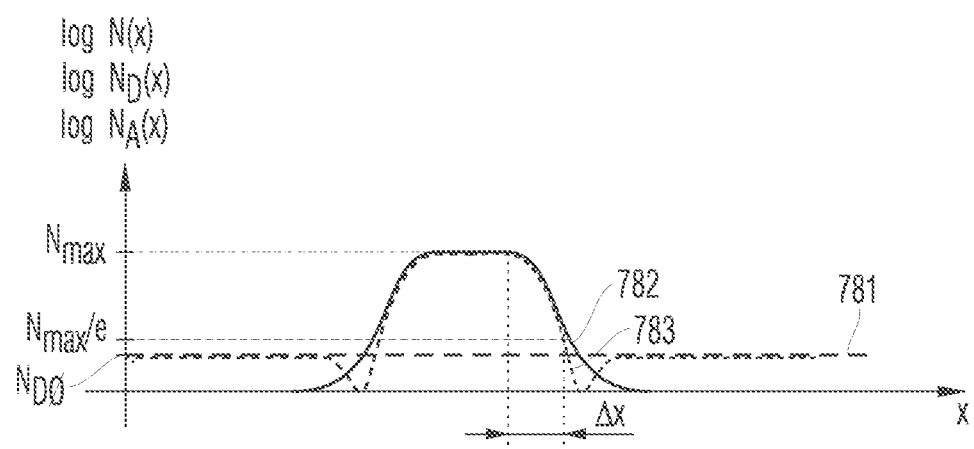
FIG. 14B is a schematic diagram illustrating a horizontal dopant distribution in the silicon carbide device portion of FIG. 14A along line B-B.

FIG. 14B shows the horizontal dopant distributions and refers to an embodiment with n-type drift zone 135 and p-type field zones 175. Line 781 shows the horizontal donator distribution ND(x), line 782 the horizontal acceptor distribution NA(x) and line 783 the horizontal net dopant distribution N(x).

The donator distribution ND(x) may result from gas phase doping during epitaxy, wherein ND(x) is approximately uniform with a mean value ND0, wherein the mean value ND0 may be equal to the dopant concentration in the drift zone 135. The field zones 175 may result from ion implantation using a laterally modulated distribution of dopants as described above such that in the field zones 175 a horizontal acceptor distribution NA(x) parallel to the first surface 101 falls from a maximum value NAmax to NAmax/e within a distance of at least 100 nm, with e representing Euler's number. The maximum acceptor concentration NAmax may be in a range from $5E16$ $cm^{-3}$ to $2E18$ $cm^{-3}$, for example, in a range from $1E17$ $cm^{-3}$ to $1E18$ $cm^{-3}$.

With NAmax>>ND0, within the field zones 175 the horizontal net dopant distribution N(x) given by line 783 closely approximates the horizontal acceptor distribution NA(x) given by line 782 and falls from the maximum value Nmax to Nmax/e within a distance $\Delta x$ of at least 200 nm, at least 500 nm, or e.g., at least 800 nm such that a transition of N(x) from NAmax to ND0 is soft, i.e., distributes across a comparatively wide horizontal distance.

With the soft transition of the horizontal dopant distribution N(x) the termination structure 170 dissipates the electric potential between the anode/body region 120 and the edge portion 137 across a wider distance than steep horizontal distributions. Peak electric field strength along the first surface 101 and in the semiconductor portion 100 is significantly reduced. Reliability of dielectric structures at the front side is improved.

Figure 15A:
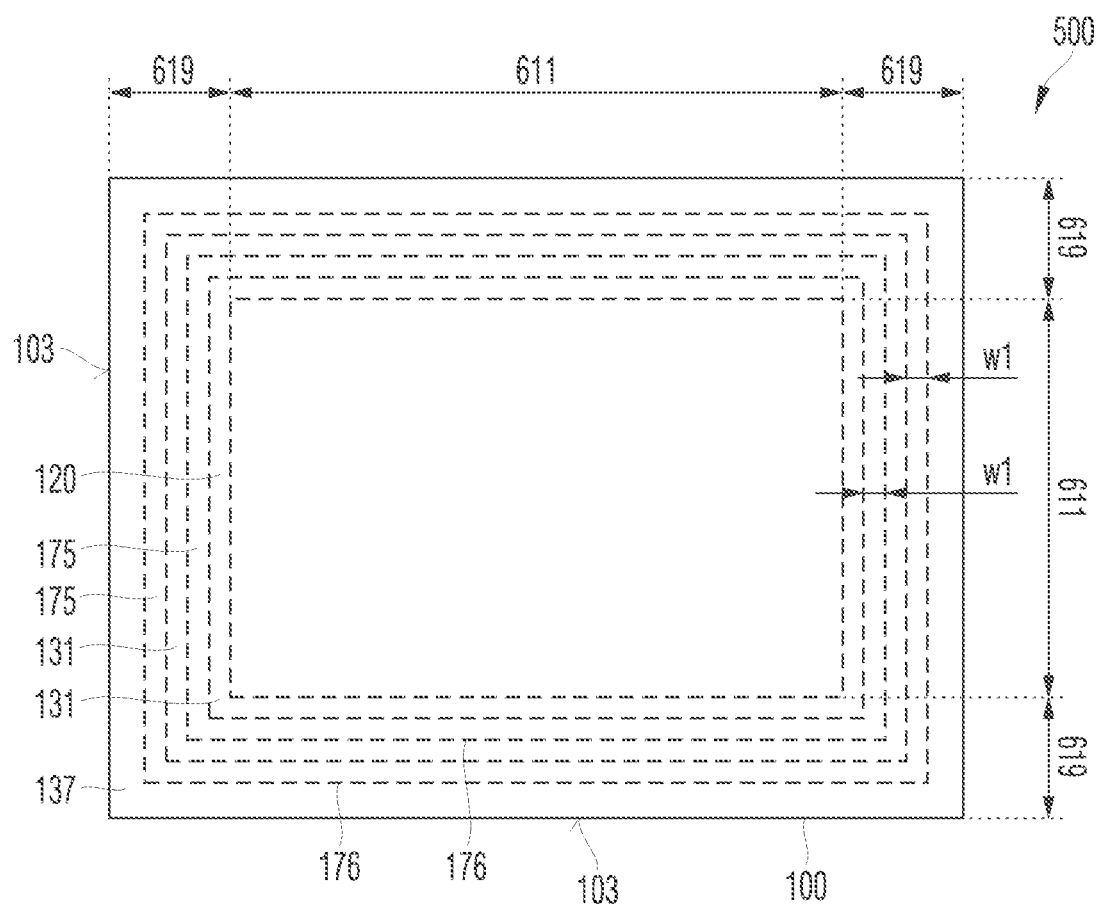
FIG. 15A is a schematic horizontal cross-sectional view of a semiconductor portion of a silicon carbide device according to an embodiment related to two field zones forming closed field rings around a central region.

In FIG. 15A the field zones 175 form closed field rings 176 of uniform lateral width w1 around the central region 611 that may include an anode/body region 120. In termination structures 170 including three or more field rings 176, the field rings 176 may be equally spaced or a distance between neighboring field rings 176 may decrease or increase with increasing distance to the central region 611.

The semiconductor device 500 in FIG. 15B includes field zones 175 that are arranged along lines forming discontinuous frames around the central region 611. The distances between neighboring field zones 175 may be uniform. Alternatively distances between neighboring field zones 175 assigned to outer frames closer to the side surface 103 may be greater than distances between neighboring field zones 175 assigned to inner frames closer to the central region 611.

Figure 16A:
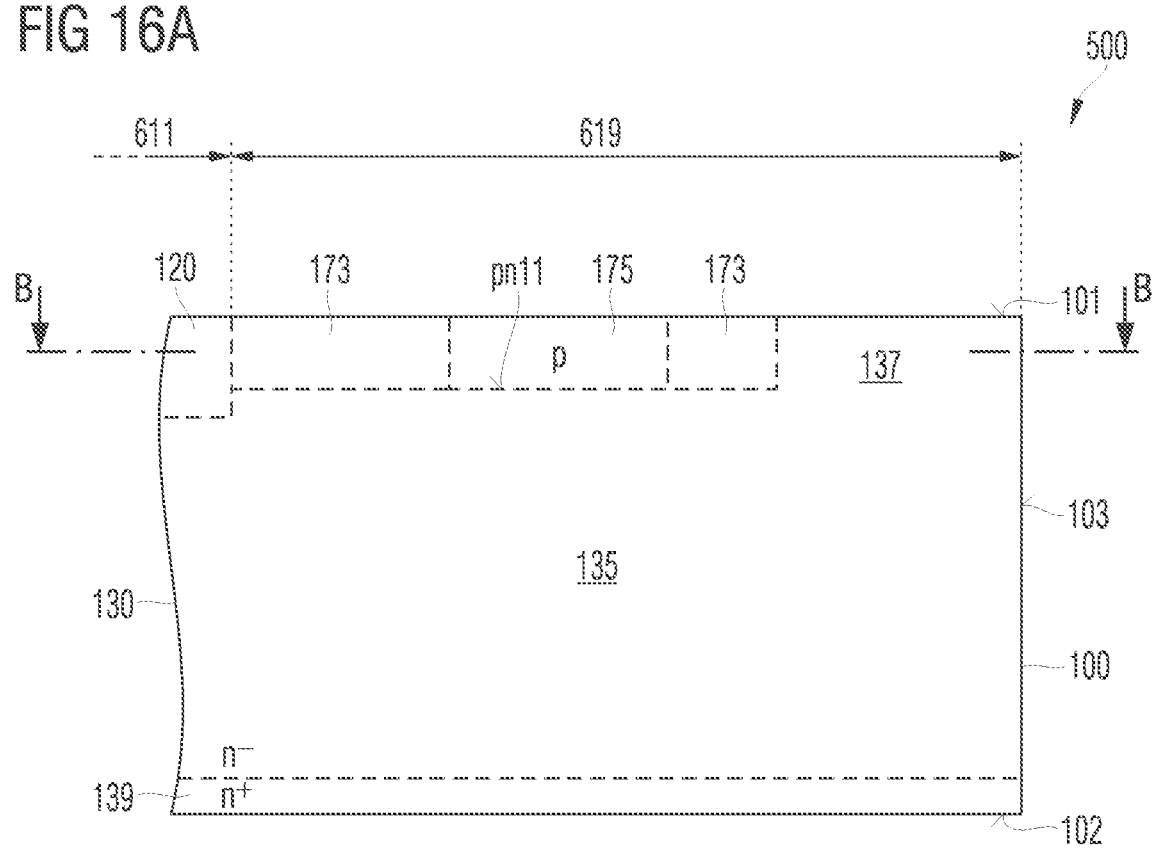
FIG. 16A is a schematic vertical cross-sectional view of a portion of a silicon carbide device according to an embodiment related to field zones with smooth horizontal dopant distributions formed in a lightly doped junction termination region.

FIG. 16A shows a semiconductor device 500 with the field zones 175 formed in a lightly doped junction termination region 173, wherein a vertical extension of the lightly doped junction termination region 173 may be equal to, greater than or smaller than a vertical extension of the field zones 175.

The net dopant distribution NJT(x) in the junction termination region 173 may result from a first p-type implant overcompensating an n-type background doping in the drift zone 135 to generate a laterally uniform net dopant concentration NJTØ. The field zones 175 result from a second ion implantation using a laterally modulated dopant distribution in the plane of the first surface 101 as described above.

Figure 16B:
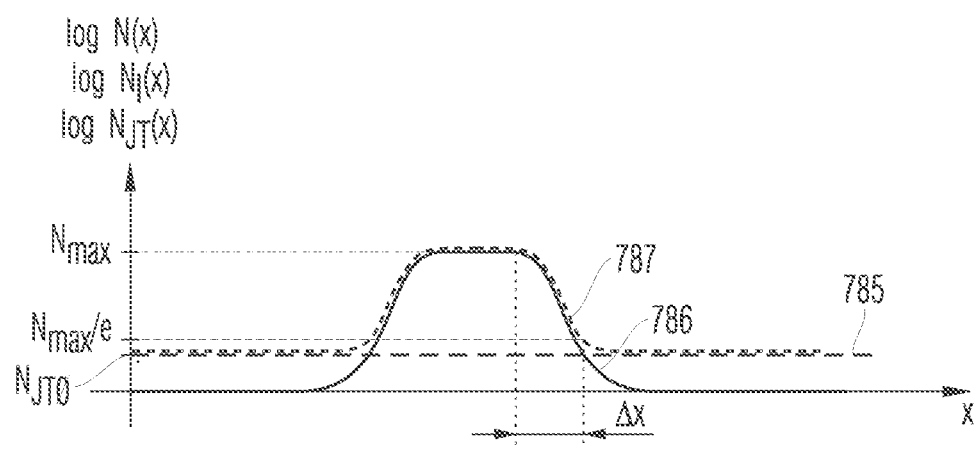
FIG. 16B is a schematic diagram illustrating a horizontal dopant distribution in the silicon carbide device portion of FIG. 16A along line B-B.

In FIG. 16B line 785 shows the horizontal net dopant distribution NJT(x) of the junction termination region 173, line 786 the horizontal implantation profile NI(x) resulting from the second ion implant and line 787 shows the total horizontal net dopant distribution N(x).

Within the field zones 175 the horizontal net dopant distribution N(x) given by line 787 closely approximates the horizontal implantation profile NI(x) given by lines 786 and falls from the maximum value Nmax to Nmax/e within a distance $\Delta x$ of at least 200 nm, at least 500 nm, or e.g., at least 800 nm.

Figure 17A:
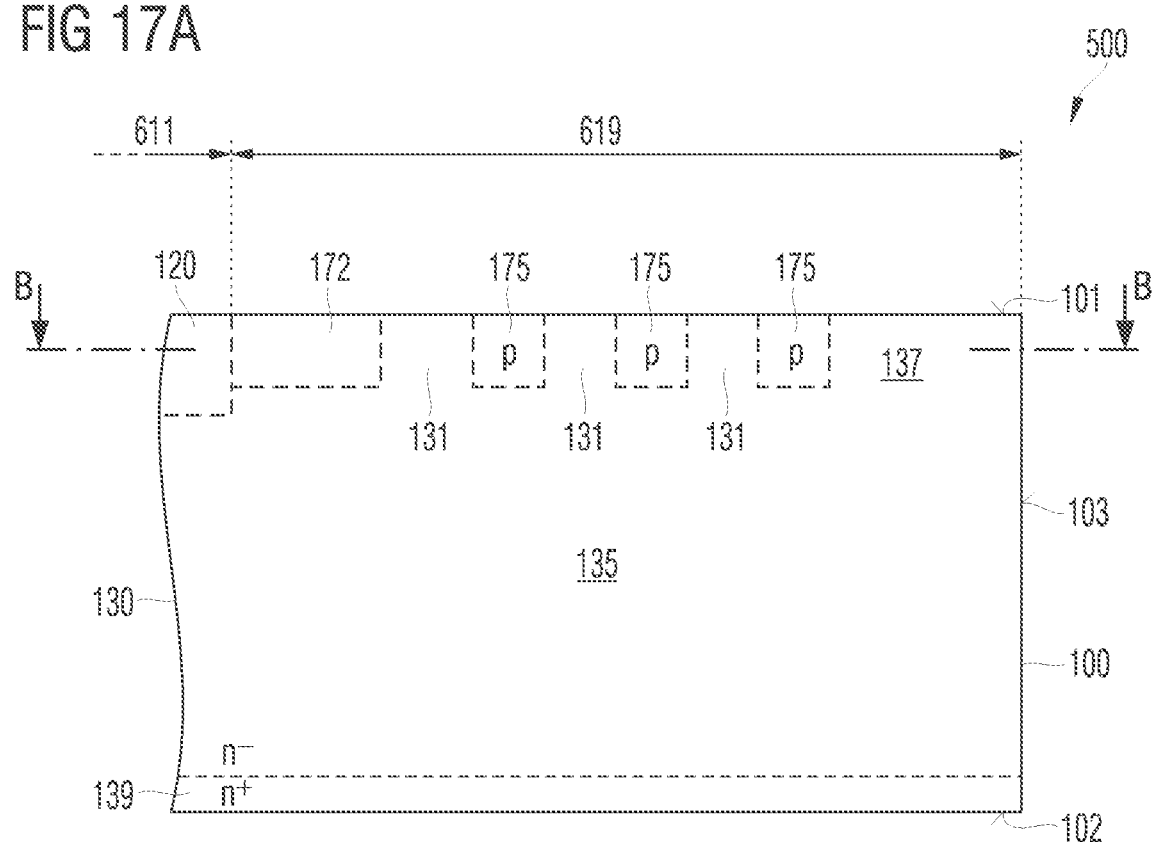
FIG. 17A is a schematic vertical cross-sectional view of a portion of a silicon carbide device according to an embodiment related to a combination of a junction termination extension and field zones with smooth horizontal dopant distributions.
Figure 17B:
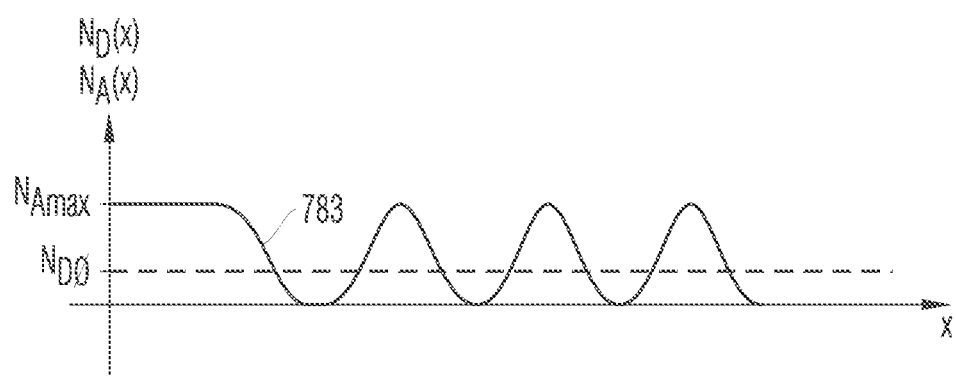
FIG. 17B is a schematic diagram illustrating a horizontal dopant distribution in the silicon carbide device portion of FIG. 17A along line B-B.

The termination structure 170 of the semiconductor device 500 in FIG. 17A combines field zones 175 with smooth horizontal dopant distributions with a junction termination extension 172 that directly adjoins an anode/body region 120 in the central region 611. In direction of the neighboring field zone 175, a horizontal dopant distribution 783 in the junction termination extension 172 may fall from a maximum value Nmax to Nmax/e within a distance $\Delta x$ of at least 200 nm, at least 500 nm, or e.g., at least 800 nm, as shown in FIG. 17B.

Figure 18:
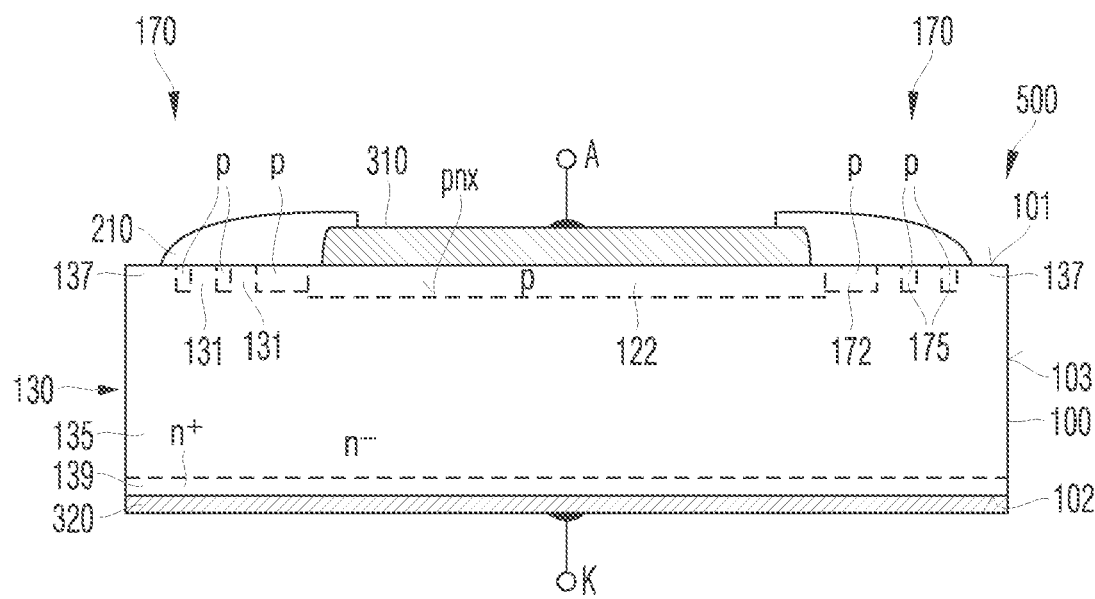
FIG. 18 is a schematic vertical cross-sectional view of a semiconductor device according to an embodiment related to a power semiconductor diode.
Figure 19:
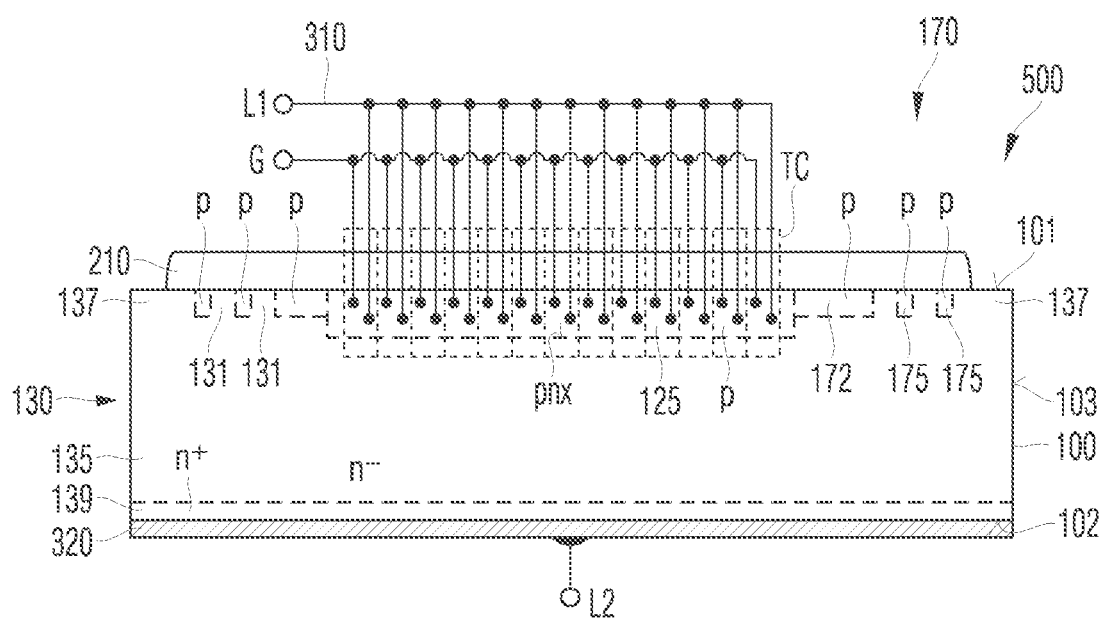
FIG. 19 is a schematic vertical cross-sectional view of a semiconductor device according to an embodiment related to a vertical power semiconductor switch.

FIGS. 18 and 19 refer to vertical cross-sections of semiconductor devices 500, wherein vertical cross-sections orthogonal to the illustrated cross-section may widely correspond to or may be qualitatively identical to the illustrated cross-sections.

In FIG. 18 the semiconductor device 500 is a power semiconductor diode with a semiconductor portion 100 made of silicon carbide. For example, the semiconductor portion 100 may be based on 4H—SiC (SiC of the 4H-polytype), 2H—SiC, 6H—SiC or 15R—SiC. A first surface 101 of the semiconductor portion 100 at the front side is parallel to an opposite second surface 102 on the back.

A drift structure 130 directly adjoins the second surface 102. The drift structure 130 may include a lightly doped drift zone 135 as well as a heavily doped base portion 139 between the drift zone 135 and the second surface 102, wherein the base portion 139 has the same conductivity type as the drift zone 135.

The drift structure 130 may be electrically connected or coupled to a second load electrode 320 through a low-resistive contact. For example, a dopant concentration in the base portion 139 along the second surface 102 is sufficiently high to form a low-resistive contact with the second load electrode 320 that directly adjoins the second surface 102.

The second load electrode 320 forms or is electrically connected or coupled to a cathode terminal K of the semiconductor diode.

A net dopant concentration in the drift zone 135 may be in a range from 1E14 cm$^{-3}$ to 3E16 cm$^{-3}$ in case the semiconductor portion 100 is based on silicon carbide. The drift structure 130 may include further doped regions between the drift zone 135 and the first surface 101 and between the drift zone 135 and the second surface 102.

In a central region, an anode region 122 forms a main pn junction pnx with the drift structure 130, for example, with the drift zone 135. The main pn junction pnx may be parallel to the first surface 101. A first load electrode 310 directly adjoins the anode region 122 and may form or may be electrically connected or coupled to an anode terminal A.

A dielectric layer 210 may cover sidewalls of the first load electrode 310. According to an embodiment, a portion of the dielectric layer 210 may be formed between the field zones 175 and an outer portion of the first load electrode 310. The termination structure 170 may have any of the configurations described above.

FIG. 19 shows a semiconductor device 500 including transistor cells TC. The semiconductor device 500 may be, for example, an IGFET, an IGBT or an MCD. As regards details of the semiconductor portion 100, the drift structure 130 and the junction termination structure 170, reference is made to the description of the semiconductor diode in FIG. 18.

Instead of an anode region, the semiconductor device 500 of FIG. 19 includes transistor cells TC, wherein in each transistor cell TC a body region 125 separates a source region from the drift structure 130. The body regions 125 form first transistor pn junctions, which correspond to the main pn junctions pnx of FIG. 18, with the drift structure 130, e.g., with the drift zone 135. The body regions 125 form second transistor pn junctions with the source zones.

A first load electrode 310 electrically connected to the body regions 125 and the source regions of the transistor cells TC may form or may be electrically connected or coupled to a first load terminal L1. The first load terminal L1 may be an anode terminal of an MCD, a source terminal of an IGFET or an emitter terminal of an IGBT.

A second load electrode 320 electrically connected to the base portion 139 may form or may be electrically connected or coupled to a second load terminal L2. The second load terminal L2 may be a cathode terminal of an MCD, a drain terminal of an IGFET or a collector terminal of an IGBT.

The transistor cells TC may be transistor cells with planar gate electrodes or with trench gate electrodes, wherein the trench gate electrodes may control a lateral channel or a vertical channel. According to an embodiment, the transistor cells TC are n-channel FET cells with p-doped body regions 125, n-doped source zones and an n-doped drift zone 135.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing semiconductor devices, the method comprising:

forming, by ion implantation, field zones of a second conductivity type that form first pn junctions with a drift layer in termination regions of a silicon carbide substrate of a first conductivity type; and laterally modulating a distribution of dopants entering the silicon carbide substrate by the ion implantation, to set a horizontal net dopant distribution in at least one of the field zones to fall from a maximum net dopant concentration Nmax to Nmax/e within at least 200 nm, with e representing Euler's number.

2. The method of claim 1, wherein neighboring ones of the field zones are laterally separated from one another by separation regions of the first conductivity type.

3. The method of claim 1, wherein neighboring ones of the field zones laterally adjoin to one another, and wherein a minimum net dopant concentration Nmin between neighboring ones of the field zones is at most 25% of the maximum net dopant concentration Nmax.

4. The method of claim 1, wherein the horizontal net dopant distribution in the field zones is set to fall from the maximum net dopant concentration Nmax to Nmax/e within at least 500 nm.

5. The method of claim 1, wherein the horizontal net dopant distribution N(x) in the field zones as a function of a horizontal distance x approximates Nmax*0.5*(1−erf((x−x0)/(σ*sqrt(2)))) with σ greater 100 nm and x0 indicating a lateral position at which N(x) has dropped to 0.5*Nmax.

6. The method of claim 1, wherein the field zones form closed field rings around central regions.

7. The method of claim 1, wherein the field zones are formed along lines forming frames around central regions.

8. The method of claim 1, wherein in the field zones the horizontal net dopant distribution monotonically falls from the maximum value Nmax to Nmax/e.

9. The method of claim 1, wherein laterally modulating the distribution of dopants comprises:

directing a collimated ion beam through a beam modifier device that comprises shading sections and diverging sections between the shading sections, wherein in the shading sections a permeability for ions of the collimated ion beam is lower than in the diverging sections, wherein diverging ion beam cones passing the diverging sections define a lateral extension of the field zones on a main surface of the silicon carbide substrate.

10. The method of claim 9, wherein the diverging sections comprises dents and protrusions in which a vertical extension of the beam modifier device gradually changes between a first thickness and a second thickness greater than the first thickness, and wherein a vertical extension of the shading sections is equal to or greater than the second thickness.

11. The method of claim 9, wherein the diverging ion beam cones are spaced from one another in a plane of the main surface.

12. The method of claim 9, wherein a width of the shading sections increases with decreasing distance to a kerf region.

13. The method of claim 9, wherein the shading sections are impermeable for ions with molecular weight equal to or greater than five at a kinetic energy of at most 2 MeV.

14. The method of claim 1, further comprising:

forming a binary mask structure, which comprises steep mask openings, on a main surface of the silicon carbide substrate; and subjecting at least portions of the binary mask structure to a heat treatment at a temperature above a reflow temperature to form, from the binary mask structure, a reflow mask with tapering mask grooves, wherein the reflow mask laterally modulates the horizontal distribution of dopants.

15. The method of claim 1, further comprising:
forming a binary mask structure comprising steep mask openings on a main surface of the silicon carbide substrate; and
using a tilt at a tilt angle between a collimated ion beam and mask sidewalls and a rotational movement between the silicon carbide substrate and the collimated ion beam for partly shadowing the collimated ion beam,
wherein the shadowing laterally modulates the horizontal distribution of dopants.

16. The method of claim 15, wherein during the implant the tilt angle between a normal to a main surface of the silicon carbide substrate and a beam axis of the collimated ion beam is at least 20°.

17. The method of claim 15, wherein the silicon carbide substrate is mounted on a substrate carrier tilted at the tilt angle to a plane orthogonal to a beam axis.

18. The method of claim 17, wherein during the implant the silicon carbide substrate rotates around a vertical axis parallel to the beam axis.

19. The method of claim 15, wherein the tilt angle is constant during the implant.

20. The method of claim 15, wherein the tilt angle gradually changes between a minimum tilt angle and a maximum tilt angle during the implant.

21. A semiconductor device, comprising:
a drift zone formed in a semiconductor portion of silicon carbide, the semiconductor portion comprising a central region and a termination region surrounding the central region, the drift zone being at a distance to a first surface of the semiconductor portion; and
a plurality of field zones in the termination region, the field zones forming first pn junctions with the drift zone,
wherein in at least one of the field zones, a horizontal net dopant distribution N(x) parallel to the first surface falls from a maximum value Nmax to Nmax/e within at distance of least 200 nm, with e representing Euler's number.

22. The semiconductor device of claim 21, further comprising:
separation regions of a conductivity type of the drift zone laterally separating neighboring ones of the field zones.

23. The semiconductor device of claim 21, wherein neighboring ones of the field zones laterally adjoin each other, and wherein a minimum net dopant concentration Nmin between neighboring ones of the field zones is at most 25% of a maximum net dopant concentration Nmax.

24. The semiconductor device of claim 21, further comprising:
a junction termination region of a conductivity type of the field zones,
wherein portions of the junction termination region laterally separate neighboring ones of the field zones.

25. The semiconductor device of claim 21, wherein at least some of the field zones form closed field rings around the central region.

26. The semiconductor device of claim 21, wherein at least some of the field zones are arranged along lines forming frames around the central region.

27. The semiconductor device of claim 21, further comprising:
a junction termination extension of a conductivity type of the field zones directly adjoining an anode/body region formed in the central region,
wherein in the junction termination extension a horizontal net dopant distribution N(x) parallel to the first surface falls from a maximum value Nmax to Nmax/e within a distance of least 200 nm.

28. The semiconductor device of claim 21, wherein the field zones are configured to float.

* * * * *

UNITED STATES PATENT AND TRADEMARK OFFICE
CERTIFICATE OF CORRECTION

PATENT NO. : 10,541,325 B2
APPLICATION NO. : 16/171911
DATED : January 21, 2020
INVENTOR(S) : Elpelt et al.

It is certified that error appears in the above-identified patent and that said Letters Patent is hereby corrected as shown below:

In the Claims

Column 28, Lines 1-2 (Claim 21, Lines 12-13), please change "within at distance of least" to -- within a distance of at least --.

Column 28, Line 33 (Claim 27, Line 9), please change "of least" to -- of at least --.

Signed and Sealed this
Twenty-fourth Day of March, 2020

Andrei Iancu
*Director of the United States Patent and Trademark Office*